(12) United States Patent
Tanaka et al.

(10) Patent No.: US 9,142,457 B2
(45) Date of Patent: Sep. 22, 2015

(54) DICING DIE BOND FILM AND METHOD OF MANUFACTURING SEMICONDUCTOR DEVICE

(75) Inventors: Shumpei Tanaka, Ibaraki (JP); Takeshi Matsumura, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 215 days.

(21) Appl. No.: 13/876,199

(22) PCT Filed: Sep. 21, 2011

(86) PCT No.: PCT/JP2011/071500
§ 371 (c)(1),
(2), (4) Date: Mar. 27, 2013

(87) PCT Pub. No.: WO2012/043340
PCT Pub. Date: Apr. 5, 2012

(65) Prior Publication Data
US 2013/0330910 A1    Dec. 12, 2013

(30) Foreign Application Priority Data
Oct. 1, 2010    (JP) .................................. 2010-224082

(51) Int. Cl.
*H01L 21/78*    (2006.01)
*H01L 21/683*    (2006.01)
(Continued)

(52) U.S. Cl.
CPC ............ *H01L 21/78* (2013.01); *H01L 21/6836* (2013.01); *H01L 24/27* (2013.01);
(Continued)

(58) Field of Classification Search
CPC ................ H01L 21/6836; H01L 21/78; H01L 2221/68327; H01L 2221/68336; H01L 2221/68377; H01L 2221/68341; H01L 2221/68381
USPC ....... 438/462, 464, 113, 114; 428/343, 355 R
See application file for complete search history.

(56) References Cited

U.S. PATENT DOCUMENTS 4,961,804 A    10/1990  Aurichio
5,705,016 A     1/1998  Senoo
(Continued)

FOREIGN PATENT DOCUMENTS

CN    1387090 A    12/2002
JP    60-057642    4/1985
(Continued)

OTHER PUBLICATIONS

Japanese Office Action dated Jun. 3, 2014; Patent Application No. 2010-224082.
(Continued)

*Primary Examiner* — Mary Wilczewski
(74) *Attorney, Agent, or Firm* — Knobbe Martens Olson & Bear LLP

(57) ABSTRACT

The present invention provides a dicing die bond film in which yielding and breaking of the dicing film are prevented and in which the die bond film can be suitably broken with a tensile force. In the dicing die bond film of the present invention, the tensile strength of the contact part in which the outer circumference of the push-up jig contacts the dicing film at 25° C. is 15 N or more and 80 N or less and the yield point elongation is 80% or more, the tensile strength of the wafer bonding part of the dicing film at 25° C. is 10 N or more and 70 N or less and the yield point elongation is 30% or more, [(the tensile strength of the contact part)−(the tensile strength of the wafer bonding part)] is 0 N or more and 60 N or less, and the breaking elongation rate of the die bond film at 25° C. is more than 40% and 500% or less.

9 Claims, 6 Drawing Sheets

(51) Int. Cl.
*H01L 23/00* (2006.01)
*H01L 23/31* (2006.01)

(52) U.S. Cl.
CPC ............ *H01L23/3121* (2013.01); *H01L 24/45* (2013.01); *H01L 24/48* (2013.01); *H01L 2221/6834* (2013.01); *H01L 2221/68336* (2013.01); *H01L 2221/68377* (2013.01); *H01L 2221/68381* (2013.01); *H01L 2224/45124* (2013.01); *H01L 2224/45144* (2013.01); *H01L 2224/45147* (2013.01); *H01L 2224/48091* (2013.01); *H01L 2224/73265* (2013.01); *H01L 2224/83191* (2013.01); *H01L 2224/85207* (2013.01); *H01L 2924/01015* (2013.01); *H01L 2924/01047* (2013.01); *H01L 2924/10253* (2013.01); *H01L 2924/3025* (2013.01); *Y10T 428/24331* (2015.01)

(56) References Cited

U.S. PATENT DOCUMENTS

| | | | |
|---|---|---|---|
| 5,882,956 A * | 3/1999 | Umehara et al. | 438/114 |
| 5,888,606 A | 3/1999 | Senoo | |
| 6,042,922 A | 3/2000 | Senoo | |
| 6,297,075 B1 * | 10/2001 | Odajima et al. | 438/110 |
| 6,342,434 B1 * | 1/2002 | Miyamoto et al. | 438/464 |
| 6,544,819 B2 * | 4/2003 | Odajima et al. | 438/118 |
| 6,573,158 B2 * | 6/2003 | Miyamoto et al. | 438/464 |
| 6,589,855 B2 * | 7/2003 | Miyamoto et al. | 438/464 |
| 6,629,553 B2 * | 10/2003 | Odashima et al. | 156/765 |
| 6,730,579 B1 * | 5/2004 | Sasaka | 438/464 |
| 8,779,586 B2 * | 7/2014 | Oonishi et al. | 257/737 |
| 2002/0173151 A1 | 11/2002 | Toyoda et al. | |
| 2004/0002199 A1 | 1/2004 | Fukuyo et al. | |
| 2004/0123925 A1 | 7/2004 | Wu | |
| 2005/0173387 A1 | 8/2005 | Fukuyo et al. | |
| 2005/0181581 A1 | 8/2005 | Fukuyo et al. | |
| 2005/0184037 A1 | 8/2005 | Fukuyo et al. | |
| 2005/0189330 A1 | 9/2005 | Fukuyo et al. | |
| 2005/0194364 A1 | 9/2005 | Fukuyo et al. | |
| 2005/0202596 A1 | 9/2005 | Fukuyo et al. | |
| 2006/0011593 A1 | 1/2006 | Fukuyo et al. | |
| 2006/0040473 A1 | 2/2006 | Fukuyo et al. | |
| 2006/0128065 A1 | 6/2006 | Inada et al. | |
| 2006/0148212 A1 | 7/2006 | Fukuyo et al. | |
| 2006/0160331 A1 | 7/2006 | Fukuyo et al. | |
| 2006/0204749 A1 * | 9/2006 | Kita et al. | 428/343 |
| 2007/0158314 A1 | 7/2007 | Fukumitsu et al. | |
| 2007/0218651 A1 | 9/2007 | Higashino | |
| 2008/0171187 A1 | 7/2008 | Inada et al. | |
| 2008/0286594 A1 | 11/2008 | Inada et al. | |
| 2008/0305583 A1 | 12/2008 | Inada et al. | |
| 2009/0186216 A1 | 7/2009 | Inada et al. | |
| 2010/0015783 A1 | 1/2010 | Fukuyo et al. | |
| 2010/0055876 A1 | 3/2010 | Fukuyo et al. | |
| 2010/0129988 A1 * | 5/2010 | Ootake et al. | 438/464 |
| 2010/0176100 A1 | 7/2010 | Fukuyo et al. | |
| 2011/0021004 A1 | 1/2011 | Fukuyo et al. | |
| 2011/0027971 A1 | 2/2011 | Fukuyo et al. | |
| 2011/0027972 A1 | 2/2011 | Fukuyo et al. | |
| 2011/0037149 A1 | 2/2011 | Fukuyo et al. | |
| 2011/0189835 A1 * | 8/2011 | Sugo et al. | 438/464 |
| 2011/0256666 A1 * | 10/2011 | Sugo et al. | 438/113 |
| 2011/0306182 A1 | 12/2011 | Fukuyo et al. | |
| 2012/0190175 A1 | 7/2012 | Fukuyo et al. | |
| 2012/0205357 A1 | 8/2012 | Fukuyo et al. | |
| 2012/0205358 A1 | 8/2012 | Fukuyo et al. | |
| 2012/0228276 A1 | 9/2012 | Fukuyo et al. | |
| 2012/0279947 A1 | 11/2012 | Fukuyo et al. | |
| 2012/0329248 A1 | 12/2012 | Fukuyo et al. | |
| 2013/0017670 A1 | 1/2013 | Fukuyo et al. | |
| 2013/0330910 A1 * | 12/2013 | Tanaka et al. | 438/462 |

FOREIGN PATENT DOCUMENTS

| | | |
|---|---|---|
| JP | 8-213349 | 8/1996 |
| JP | 10-242084 | 9/1998 |
| JP | 2002-192370 | 7/2002 |
| JP | 2003-007649 | 11/2003 |
| JP | 2003-338467 | 11/2003 |
| JP | 2006-203133 | 8/2006 |
| JP | 2007-005436 | 1/2007 |
| JP | 2007-053325 | 3/2007 |
| JP | 2007-150206 | 6/2007 |
| JP | 2007-250598 | 9/2007 |
| JP | 2009-094127 | 4/2009 |
| JP | 2009-283925 | 4/2009 |
| JP | 2009-231570 | 10/2009 |
| JP | 2010-34263 | 2/2010 |
| JP | 2010-74144 | 4/2010 |
| JP | 2010-232611 | 10/2010 |
| WO | WO 2004/109786 | 12/2004 |

OTHER PUBLICATIONS

International Preliminary Report on Patentability dated Apr. 18, 2013 in PCT/JP11/071500, translation by International Bureau.
International Search Report dated Nov. 29, 2011 in corresponding application No. PCT/JP2011/071500.
Notification of Reasons for Refusal dated Nov. 19, 2013 in corresponding Japanese patent application No. 2010-224082.
Chinese Office Action, dated May 7, 2015, in corresponding to Chinese Patent Application No. 201180047744.3.

* cited by examiner (a)

(b)

(a)

(b)

(a)

(b)

US 9,142,457 B2

DICING DIE BOND FILM AND METHOD OF MANUFACTURING SEMICONDUCTOR DEVICE

This application is the U.S. National Phase under 35 U.S.C. §371 of International Application No. PCT/JP2011/071500, filed Sep. 21, 2011, which claims priority to Japanese Patent Application No. 2010-224082, filed Oct. 1, 2010. The International Application was not published in English under PCT Article 21(2).

TECHNICAL FIELD

The present invention relates to a dicing die bond film in which a die bond film and a dicing film are laminated. The present invention also relates to a method of manufacturing a semiconductor device using the dicing die bond film.

BACKGROUND ART

Conventionally, silver paste has been used to bond a semiconductor chip to a lead frame or an electrode member in the step of producing a semiconductor device. The treatment for the sticking is conducted by coating a paste-form adhesive on a die pad of a lead frame, or the like, mounting a semiconductor chip on the die pad, and then setting the paste-form adhesive layer.

However, about the paste-form adhesive, the amount of the coated adhesive, the shape of the coated adhesive, and on the like are largely varied in accordance with the viscosity behavior thereof, a deterioration thereof, and on the like. As a result, the thickness of the formed paste-form adhesive layer becomes uneven so that the reliability in strength of bonding a semiconductor chip is poor. In other words, if the amount of the paste-form adhesive coated on an electrode member is insufficient, the bonding strength between the electrode member and a semiconductor chip becomes low so that in a subsequent wire bonding step, the semiconductor chip is peeled. On the other hand, if the amount of the coated paste-form adhesive is too large, this adhesive flows out to stretch over the semiconductor chip so that the characteristic becomes poor. Thus, the yield or the reliability lowers. Such problems about the adhesion treatment become particularly remarkable with an increase in the size of semiconductor chips. It is therefore necessary to control the amount of the coated paste-form adhesive frequently. Thus, the workability or the productivity is deteriorated.

In this coating step of a paste-form adhesive, there is a method of coating the adhesive onto a lead frame or a forming chip by an independent operation. In this method, however, it is difficult to make the paste-form adhesive layer even. Moreover, an especial machine or a longtime is required to coat the paste-form adhesive. Thus, a dicing film which makes a semiconductor wafer to be bonded and held in a dicing step and further gives an adhesive layer, for bonding a chip, which is necessary for a mounting step is disclosed (refer to Patent Document 1, for example).

This dicing film has a structure wherein a adhesive layer and an adhesive layer are successively laminated on a supporting substrate. That is, a semiconductor wafer is diced in the state that the wafer is held on the adhesive layer, and then the supporting substrate is extended; the chipped works are peeled together with the adhesive layer; the peeled works are individually collected; and further the chipped works are bonded onto an adherend such as a lead frame through the adhesive layer.

When a dicing die bond film including a dicing film and a die bond film laminated thereon is used and a semiconductor wafer is diced while being held by the die bond film, it is necessary to cut the die bond film and the semiconductor wafer at the same time. However, in a general dicing method using a diamond blade, it is necessary to reduce the cutting speed and costs are increased because there are potential problems such as adhesion of the die bond film with the dicing film due to heat that is generated during dicing, sticking of semiconductor chips due to generation of cutting scraps, and attachment of cutting scraps onto the side of the semiconductor chips.

In recent years, a method of forming grooves on the surface of a semiconductor wafer and then performing backside grinding to obtain an individual semiconductor chip (refer to Patent Document 2, for example, also referred to as "a DBG (Dicing Before Grinding) method") and a method of forming a modified region by irradiating a line to be divided on the semiconductor wafer with a laser beam to make the division of the semiconductor wafer easy at the line to be divided and then applying a tensile force to break the semiconductor wafer and obtain an individual semiconductor chip (refer to Patent Documents 3 and 4, for example, also referred to as "Stealth Dicing (a registered trademark)") have been proposed. According to these methods, the occurrence of poor operations such as chipping can be decreased especially in the case where the semiconductor wafer is thin, and the kerf width is made to be narrower than the conventional kerf width to improve the yield of the semiconductor chip.

It is necessary to break the die bond film by applying a tensile force to obtain individual semiconductor chips with a die bond film by the above-described method while the semiconductor wafer is being held by the die bond film.

In Patent Document 5, an adhesive sheet is disclosed which is used in the DBG method and the Stealth Dicing method and in which the breaking strength at 25° C. is 0.1 MPa or more and 10 MPa or less and the breaking elongation rate is 1% or more and 40% or less. However, because the breaking elongation rate of the adhesive sheet of Patent Document 5 is 40% or less, it may break before the semiconductor wafer breaks when the tensile force is applied in the Stealth Dicing method, and the semiconductor wafer may be divided at a line that is different from the line to be divided.

In Patent Document 6, a dicing tape is disclosed that is used in the Stealth Dicing method and in which the tensile load at 10% of the tape elongation rate is 15 N or more. However, in the case where the yield point elongation of the dicing tape of Patent Document 6 itself is small, the dicing tape undergoes plastic deformation or breaks in the expansion step, and therefore, a normal dicing may not be performed.

Further, in Patent Document 7, a dicing tape integrated adhesive sheet is disclosed that is used in the DBG method and the Stealth Dicing method and having a dicing tape in which the yield point is not shown in tensile deformation and an adhesive sheet in which the break elongation exceeds 40% and 400% or less. However, in the case where the break elongation of the dicing tape of the dicing tape integrated adhesive sheet of Patent Document 7 is too small, the adhesive sheet may firstly break in the expansion step.

PRIOR ART DOCUMENTS

Patent Documents

Patent Document 1: JP-A-60-57642
Patent Document 2: JP-A-2003-007649
Patent Document 3: JP-A-2002-192370

Patent Document 4: JP-A-2003-338467
Patent Document 5: WO 2004/109786
Patent Document 6: JP-A-2007-53325
Patent Document 7: JP-A-2009-283925

SUMMARY OF THE INVENTION

Problems to be Solved by the Invention

The present invention is performed in view of the above-described problems, and the objective is to provide a dicing die bond film in which yielding and breaking of the dicing film can be prevented and in which the die bond film can be suitably broken by a tensile force.

Another objective of the present invention is to provide a method of manufacturing a semiconductor device in which yielding and breaking of the dicing film can be prevented and in which the die bond film can be suitably broken by a tensile force.

Means for Solving the Problems

The inventors investigated a dicing die bond film to solve the conventional problems. As a result, the present inventors found that the tensile strength of the dicing film at a contact part where the outer circumference of a push-up jig contacts the dicing film and the yield point elongation of the dicing film are made to be within a specific range, the difference between the tensile strength of the contact part and the tensile strength of a wafer bonding part of the dicing film where the semiconductor wafer is bonded is made to be within a specific range, and the breaking elongation rate of the die bond film is made to be within a specific range to prevent yielding and breaking of the dicing film and to be able to suitably break the die bond film by the tensile force, and the present invention has been completed.

That is, the dicing die bond film according to the present invention is a dicing die bond film in which a die bond film is provided on a dicing film, wherein the film is used in a method of forming a modified region by irradiating a semiconductor wafer with a laser beam and then breaking the semiconductor wafer at the modified region to obtain a semiconductor element from the semiconductor wafer or a method of forming grooves which do not reach to the backside on the surface of the semiconductor wafer and then performing backside grinding of the semiconductor wafer so that the grooves are exposed from the backside to obtain a semiconductor element from the semiconductor wafer, and wherein the dicing film has a ring bonding part in which a dicing ring is bonded located at the outer circumference part, a wafer bonding part in which the semiconductor wafer is bonded inward of the ring bonding part, and a contact part in which the outer circumference of the push-up jig contacts between the ring bonding part and the wafer bonding part, and that the tensile strength of the contact part of the dicing film at 25° C. is 15 N or more and 80 N or less, the yield point elongation is 80% or more, the tensile strength of the wafer bonding part of the dicing film at 25° C. is 10 N or more and 70 N or less, the yield point elongation is 30% or more, [(the tensile strength of the contact part)−(the tensile strength of the wafer bonding part)] is 0 N or more and 60 N or less, and the breaking elongation rate of the die bond film at 25° C. is more than 40% and 500% or less.

When the semiconductor element (for example, a semiconductor chip) is obtained from the semiconductor wafer by the Stealth Dicing method or the DBG method, it is necessary to apply a tensile force to the dicing film and the die bond film to break the die bond film in a condition in which the dicing film is not broken. Because of that, when the tensile force is applied, it is necessary that the tensile strength of the contact part in which the push-up jig contacts is at least the same as or larger than the tensile strength of the wafer bonding part in which the push-up jig does not contact. Further, the wafer bonding part is necessarily expanded when the tensile force is applied.

According to the above-described configuration, [(the tensile strength of the contact part)−(the tensile strength of the wafer bonding part)] is 0 N or more and 60 N or less. Because the tensile strength at the contact part of the dicing film at 25° C. is 15 N or more, breaking and plastic deformation of the dicing film at the contact part are prevented when the tensile force is applied, and the tensile stress can be transmitted to the die bond film. As a result, the die bond film can be broken in a normal manner. Because the tensile strength is 80 N or less, the die bond film can be broken without giving an excessive load to the machine for applying the tensile force. Further, because the yield point elongation at the contact part of the dicing film at 25° C. is 80% or more, the dicing film can be expanded while suppressing the plastic deformation of the dicing film. Because the tensile strength at the wafer bonding part at 25° C. is 10 N or more, the tensile stress can be transmitted to the die bond film well. Further, because the tensile strength at the wafer bonding part at 25° C. is 70 N or less, the appropriate expansion occurs in the wafer bonding part when the tensile force is applied, and the die bond film can be broken. Because the yield point elongation of the wafer bonding part is 30% or more, the appropriate expansion occurs in the wafer bonding part when the tensile force is applied, and the die bond film can be broken. Further, because the breaking elongation rate of the die bond film is larger than 40%, the film is prevented from easily breaking, and a handling property can be improved. Because the breaking elongation rate is 500% or less, excessive elongation can be prevented, and its can be suitably broken when the film is expanded.

That is, according to the above-described configuration, because the tensile strength at the contact part of the dicing film at 25° C. is 15 N or more and 80 N or less, the yield point elongation is 80% or more, the tensile strength of the wafer bonding part of the dicing film at 25° C. is 10 N or more and 70 N or less, the yield point elongation is 30% or more, and [(the tensile strength of the contact part)−(the tensile strength of the wafer bonding part)] is 0 N or more and 60 N or less, the dicing film can be expanded without breaking it and the die bond film can be broken when the tensile force is applied.

In the above-described configuration, the dicing film preferably has a structure in which a base and a reinforcing member are laminated at least in the contact part. When the dicing film has a structure in which a base and a reinforcing member are laminated at least in the contact part, the tensile force at the contact part can be increased when the tensile force is applied, and the die bond film can be broken in a normal manner.

In the above-described configuration, the dynamic friction coefficient of the contact part of the dicing film is preferably 0 to 0.02. When the dynamic friction coefficient of the contact part of the dicing film is 0.2 or less, the friction with the push-up jig can be decreased when the tensile force is applied, and the die bond film can be broken in a normal manner.

In the above-described configuration, the surface roughness Ra of the contact part is 0.03 μm or more and 1.5 μm or less, or the contact part is preferably treated with a lubricant. When the surface roughness Ra of the contact part is 0.03 μm or more or when the contact part is treated with a lubricant, the friction with the push-up jig can be suitably decreased when the tensile force is applied, and the die bond film can be broken in a normal manner.

DESCRIPTION OF THE REFERENCE SIGNS

Figure 1:
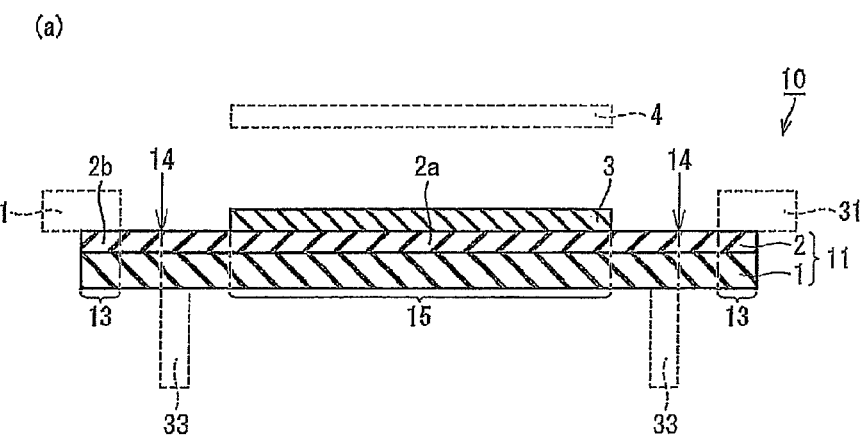
FIG. 1(a) is a cross-sectional schematic diagram showing the dicing die bond film according to one embodiment of the present invention.
FIG. 1(b) is its planar drawing.
Figure 1:
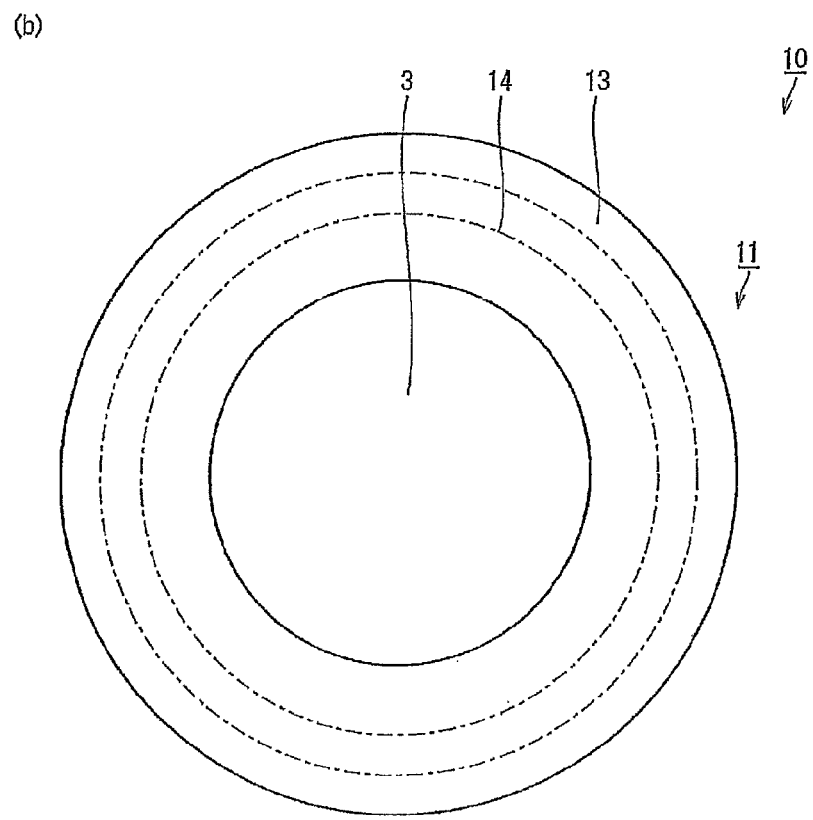

1 Base
2 Pressure-Sensitive Adhesive Layer
3 Die Bond Film
4 Semiconductor Wafer
5 Semiconductor Chip
6 Adherend
7 Bonding Wire
8 Sealing Resin
10, 12, 20, 21 Dicing Die Bonding Film
11, 18, 19 Dicing Film
13 Ring Bonding Part
14 Contact Part
15 Wafer Bonding Part
31 Dicing Ring
33 Push-Up Jig

MODE FOR CARRYING OUT THE INVENTION (Dicing Die Bond Film)

The dicing die bond film according to the present embodiment is explained below. FIG. 1(a) is a cross-sectional schematic diagram showing the dicing die bond film according to one embodiment of the present invention, and FIG. 1(b) is its planar drawing. FIG. 2 is a cross-sectional schematic diagram showing the dicing die bond film according to another embodiment of the present invention.

A dicing die bond film 10 has a configuration in which a die bond film 3 is laminated on a dicing film 11. A pressure-sensitive adhesive layer 2 is laminated on a base 1 to configure the dicing film 11, and the die bond film 3 is provided on the pressure-sensitive adhesive layer 2. The die bond film 3 is formed only on a part 2a corresponding to the semiconductor wafer bonding part of the pressure-sensitive adhesive layer 2. In the present invention, a configuration may be adopted in which a die bond film 3' is formed on the entire surface of the dicing film 11 as shown in FIG. 2 showing a dicing die bond film 12.

Figure 2:
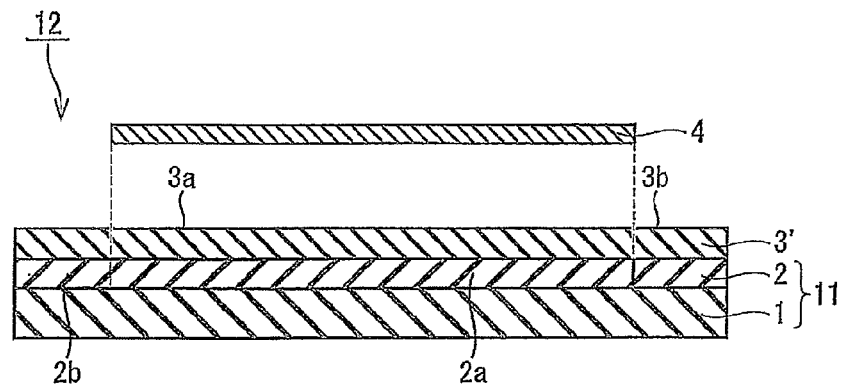
FIG. 2 is a schematic sectional view showing a dicing die bond film according to another embodiment of the present invention.

As shown in FIGS. 1 (a) and 1 (b), the dicing film 11 has a ring bonding part 13 in which a dicing ring 31 is bonded to the outer circumference part, and a wafer bonding part 15 in which a semiconductor wafer 4 is bonded inward of the ring bonding part 13. Further, the dicing film has a contact part 14 in which the outer circumference of a push-up jig 33 contacts between the ring bonding part 13 and the wafer bonding part 15.

In the dicing film 11, [(the tensile strength of the contact part 14)−(the tensile strength of the wafer bonding part 15)] is 0 N or more and 60 N or less, preferably 0 N or more and 58 N or less, and more preferably 0 N or more and 55 N or less.

The tensile strength at the contact part 14 of the dicing film 11 under a condition of 25° C. is 15 N or more and 80 N or less, preferably 20 N or more and 75 N or less, and more preferably 25 N or more and 70 N or less. Because the tensile strength at the contact part 14 of the dicing film 11 under a condition of 25° C. is 15 N or more, breaking and plastic deformation of the dicing film 11 at the contact part 14 are prevented when the tensile force is applied, and the die bond film 3 can be broken in a normal manner. Because the tensile strength is 80 N or less, the die bond film 3 can be broken without giving an excessive load to the machine for applying the tensile force.

The yield point elongation at the contact part 14 of the dicing film 11 at 25° C. is 80% or more, preferably 85% or more, and more preferably 90% or more. The larger the yield point elongation at the contact part 14 of the dicing film 11 at 25° C. is the better. However, it may be 330% or less, 300% or less, 290% or less, 260% or less, 250% or less, and the like. Because the yield point elongation at the contact part 14 of the dicing film 11 at 25° C. is 80% or more, the plastic deformation of the dicing film can be suppressed, and breaking of the dicing film can be prevented.

The tensile strength at the wafer bonding part 15 of the dicing film 11 at 25° C. is 10 N or more and 70 N or less, preferably 11 N or more and 50 N or less, and more preferably 12 N or more and 40 N or less. Because the tensile strength at the wafer bonding part 15 at 25° C. is 10 N or more, the tensile stress can be transmitted to the die bond film well. Further, because the tensile strength at the wafer bonding part 15 at 25° C. is 70 N or less, the appropriate expansion occurs in the wafer bonding part 15 when the tensile force is applied, and the die bond film 3 can be broken.

The yield point elongation at the wafer bonding part 15 of the dicing film 11 at 25° C. is 30% or more, and preferably 35% or more. The larger yield point elongation at the wafer bonding part 15 of the dicing film 11 at 25° C. is better. However, it may be 330% or less, 300% or less, 290% or less, 260% or less, 250% or less, and the like. Because the yield point elongation of the wafer bonding part 15 is 30% or more, the appropriate expansion occurs at the wafer bonding part 15 when the tensile force is applied, and the die bond film 3 can be broken.

The tensile strength is the strength at 10% elongation where a width of the sample is 25 mm, the distance between chucks is 100 mm, and the tensile speed is 300 ram/min. Further, the yield point elongation is the elongation rate at the yield point of a stress-strain curve that is obtained when the measurement is performed under a condition of 25° C. where the width of the sample is 10 mm, the distance between chucks is 50 mm, and the tensile speed is 300 ram/min. In the present invention, the breaking elongation is made to be the yield point elongation for a dicing film which does not have the yield point. In the case where the tensile test is performed under a condition of 25° C. where the width of the sample is 10 mm, the distance between chucks is 50 mm, and the tensile speed is 300 mm/min, and the data are plotted with the strain being the x-axis and the stress being the y-axis, the slope dy/dx of the data from the dicing film having the yield point change from a positive value to 0 or a negative value.

The base 1 preferably has ultraviolet transmissivity and is a base body for strength of the dicing die bond film. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base 1 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 2 and the die bond films 3, 3' is reduced by thermally shrinking the base 1 after dicing, and the recovery of the semiconductor chips (a semiconductor element) can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base 1 in order to improve adhesiveness, holding properties, etc. with the adjacent layer. The same type or different type of base can be appropriately selected and used as the base 1, and a base in which a plurality of types are blended can be used depending on necessity. Further, a vapor-deposited layer of a conductive substance composed of a metal, an alloy, an oxide thereof, etc. and having a thickness of about 30 to 500 angstrom can be provided on the base 1 in order to give an antistatic function to the base 1. The base 1 may be a single layer or a multi layer of two or more types.

The thickness of the base 1 can be appropriately decided without limitation particularly. However, it is generally about 5 to 200 μm. When the base 1 is too thick, the pickup property may deteriorate.

The dicing film 11 may have a structure in which the base 1 and a reinforcing member are laminated at least on the contact part 14. This case is explained below.

Figure 3:
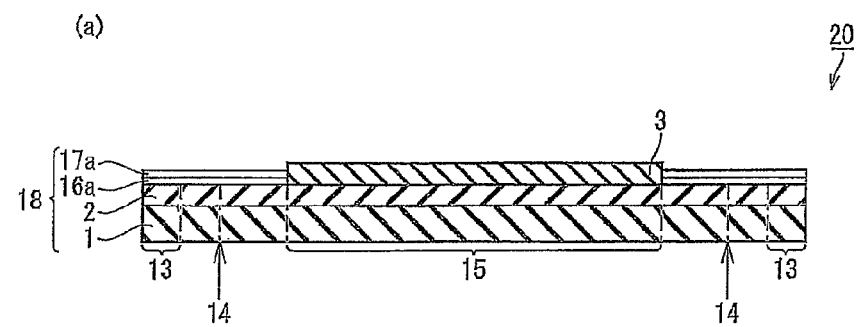
FIGS. 3(a) and 3(b) are cross-sectional schematic diagrams showing the dicing die bond film according to other embodiments.
Figure 3:
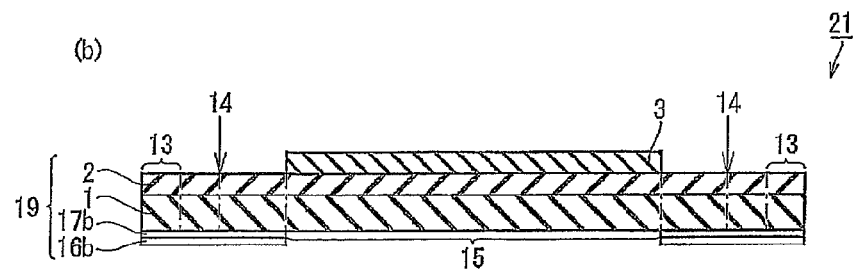
Figure 4:
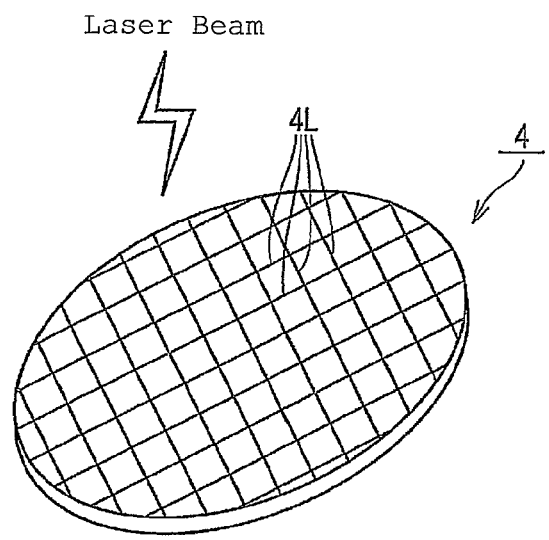
FIG. 4 is a schematic sectional view for explaining one method of manufacturing a semiconductor device according to the present embodiment.

FIG. 3 (*a*) is a cross-sectional schematic diagram showing the dicing die bond film according to another embodiment.

In a dicing die bond film 20 shown in FIG. 3 (*a*), a dicing film 18 has a structure in which the pressure-sensitive adhesive layer 2 is laminated on the base 1, and a reinforcing member 16a is laminated on the layer. The reinforcing member 16a is provided on the adhesive layer 2 in a region where it does not face the wafer bonding part 15, and the reinforcing member is provided to be included in both of the contact part 14 and the ring bonding part 13. The reinforcing member 16a may be provided to be included only in the contact part 14. In the case of a configuration in which the reinforcing member 16a is provided on the adhesive layer 2, it can be a configuration in which an adhesive layer 17a for bonding the dicing ring on the reinforcing member 16a is provided as shown in FIG. 3 (*a*).

FIG. 3 (*b*) is a cross-sectional schematic diagram showing the dicing die bond film according to another embodiment.

In the dicing die bond film 21 shown in FIG. 3 (*b*), a dicing film 19 has a structure in which the pressure-sensitive adhesive layer 2 is laminated on the base 1, and a reinforcing member 16b is laminated on the backside of the base 1. The reinforcing member 16b is provided on the backside of the base 1 in a region where the reinforcing member does not face the wafer bonding part 15, and the reinforcing member is provided to be included in both of the contact part 14 and the ring bonding part 13. The reinforcing member 16b may be provided to be included only in the contact part 14. In the case of a configuration in which the reinforcing member 16b is provided on the backside of the base 1, the reinforcing member can be a configuration in which an adhesive layer 17b for bonding the reinforcing member 16b on the backside of the base 1 is provided as shown in FIG. 3 (*b*).

The same materials as the base 1 can be used as the material of the reinforcing members 16 (the reinforcing member 16a and the reinforcing member 16b).

The thickness of the reinforcing member 16 can be appropriately determined with special limitation. However, it is preferably 5 to 70 μm, more preferably 8 to 40 μm, and further preferably 10 to 20 μm.

The tensile strength of the reinforcing members 16 is preferably 15 N or more and 80 N or less, more preferably 20 N or more and 60 N or less, and further preferably 25 N or more and 50 N or less. The tensile strength of the reinforcing members 16 can be measured with the same method as the dicing film 11.

The dynamic friction coefficient of the contact part 14 is preferably 0 to 0.02, more preferably 0 to 0.019, and further preferably 0 to 0.018. When the dynamic friction coefficient of the contact part 14 is 0.02 or less, the friction with the push-up jig 33 can be decreased when the tensile force is applied, and the die bond film 11 can be broken in a normal manner. As shown in FIG. 3 (*a*), in the case where the base 1 contacts the push-up jig 33, the dynamic friction coefficient at the contact part 14 of the base 1 is preferably in the above-described value range. As shown in FIG. 3 (*b*), in the case where the reinforcing member 16b contacts the push-up jig 33, the dynamic friction coefficient at the contact part 14 of the reinforcing member 16b is preferably in the above-described value range.

The surface roughness Ra of the contact part 14 is preferably 0.03 μm or more and 1.5 μm or less, and more preferably 0.05 μm or more and 1.4 μm or less. When the surface roughness Ra of the contact part is 0.03 μm or more, the friction with the push-up jig 33 can be suitably decreased when the tensile force is applied, and the die bond film 11 can be broken in a normal manner. The surface roughness Ra can be controlled with an emboss treatment. As shown in FIGS. 1 (*b*) and 3 (*a*), in the case where the base 1 contacts to the push-up jig 33, the surface roughness Ra at the contact part 14 of the base 1 is preferably in the above-described value range. As shown in FIG. 3 (*b*), in the case where the reinforcing member 16*b* contacts the push-up jig 33, the surface roughness Ra at the contact part 14 of the reinforcing member 16*b* is preferably in the above-described value range.

A lubricant treatment is preferably performed on the contact part 14. A conventionally known lubricant can be adopted, and examples include a silicone based lubricant and a fluorine based lubricant. When the lubricant treatment is performed on the contact part 14, the friction with the push-up jig 33 can be suitably decreased when the tensile force is applied, and the die bond film can be broken in a normal manner.

The base 1 can be configured from a part corresponding to the contact part 14 and a part corresponding to the wafer bonding part 15 which are different materials from each other. With this, a difference of the tensile strength and the yield point elongation can be provided between the contact part 14 and the wafer bonding part 15. Examples of a method of manufacturing the base 1 that is configured from a part corresponding to the contact part 14 and a part corresponding to the wafer bonding part 15 which are different materials from each other include a method of embedding bases having a different tensile strength and/or a different yield point elongation into another base in which a part corresponding to the wafer bonding part 15 is cut out. Examples of another method include a method of painting differently the part corresponding to the contact part 14 and the wafer bonding part 15 in advance when the base 1 is formed.

The pressure-sensitive adhesive that is used to form the pressure-sensitive adhesive layer 2 is not especially limited. Examples include a general pressure-sensitive adhesive such as an acrylic pressure-sensitive adhesive and a rubber based pressure-sensitive adhesive. As the pressure-sensitive adhesive, an acrylic pressure-sensitive adhesive having an acrylic polymer as a base polymer is preferable from the aspect of a cleaning and washing property of a semiconductor wafer and an electronic component such as a glass which are vulnerable to contamination by ultrapure water and an organic solvent such as alcohol.

Examples of the acrylic polymer include acrylic polymers using, as a monomer component, one or more kinds of (meth) acrylic acid alkyl esters (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and (meth)acrylic acid cycloalkyl esters (for example, cyclopentylester, cyclohexylester, etc.). The (meth)acrylic acid ester means an acrylic acid ester and/or a methacrylic acid ester, and has very the same meaning as (meth) in the present invention.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth) acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth) acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

The acrylic polymer can be obtained by polymerizing a monomer alone or a mixture of two or more kinds of monomers. The polymerization can be conducted by any of methods such as solution polymerization, emulsion polymerization, bulk polymerization and suspension polymerization.

The content of a low-molecular weight material is preferably small from the viewpoint of preventing contamination of a clean adherend. In this respect, the weight average molecular weight of the acrylic polymer is preferably 300,000 or more, and more preferably from about 400,000 to 3,000,000.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the pressure-sensitive adhesive. In general, the crosslinking agent is compounded preferably about 5 parts by weight or less, and more preferably 0.1 to 5 parts by weight to 100 parts by weight of the base polymer. The conventionally known various additives such as a tackifier and an anti-aging agent may be used as the pressure-sensitive adhesive besides the above-described components as needed.

The pressure-sensitive adhesive layer 2 can be formed by an ultraviolet ray curing-type pressure-sensitive adhesive. The ultraviolet ray curing-type pressure-sensitive adhesive can easily decrease its adhesive strength by increasing the degree of crosslinking by irradiation with ultraviolet. By radiating only a part 2a corresponding to the semiconductor wafer pasting part of the pressure-sensitive adhesive layer 2 shown in FIG. 1, a difference of the adhesive strength to another part 2b can be also provided.

Further, by curing the ultraviolet ray curing-type pressure sensitive adhesive layer 2 with the die bond film 3 shown in FIG. 1, the part 2a in which the adhesive strength is remarkably decreased can be formed easily. Because the die bond film 3 is pasted to the part 2a in which the adhesive strength is decreased by curing, the interface of the part 2a of the pressure-sensitive adhesive layer 2 and the die bond film 3 has a characteristic of being easily peeled during pickup. On the other hand, the part not radiated by ultraviolet rays has sufficient adhesive strength, and forms the part 2b.

In the dicing die bond film 12 shown in FIG. 2, the part 2b formed by a non-cured ultraviolet ray curing-type pressure-sensitive adhesive sticks to the die bond film 3', and the holding force when dicing can be secured. In such a way, the ultraviolet ray curing-type pressure-sensitive adhesive can support the die bond film 3' for fixing the semiconductor chip onto an adherend such as a substrate with good balance of adhesion and peeling. In the pressure-sensitive adhesive layer 2 of the dicing die bond film 10 shown in FIG. 1, a dicing ring can be fixed to the part 2b.

The ultraviolet ray curing-type pressure-sensitive adhesive that is used has a ultraviolet curable functional group of a radical reactive carbon-carbon double bond, etc., and adherability. Examples of the ultraviolet ray curing-type pressure-sensitive adhesive are an added type ultraviolet ray curing-type pressure-sensitive adhesive in which a ultraviolet curable monomer component or an oligomer component is compounded into an acryl pressure sensitive adhesive or a rubber pressure sensitive adhesive.

The pressure-sensitive adhesive is preferably an acrylic pressure-sensitive adhesive containing an acrylic polymer as a base polymer in view of clean washing of electronic components such as a semiconductor wafer and glass, which are easily damaged by contamination, with ultrapure water or an organic solvent such as alcohol.

Examples of the acrylic polymer include acrylic polymers using, as a monomer component, one or more kinds of (meth)acrylic acid alkyl esters (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and (meth)acrylic acid cycloalkyl esters (for example, cyclopentylester, cyclohexylester, etc.). The (meth)acrylic acid ester means an acrylic acid ester and/or a methacrylic acid ester, and has very the same meaning as (meth) in the present invention.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

The acrylic polymer can be obtained by polymerizing a monomer alone or a mixture of two or more kinds of monomers. The polymerization can be conducted by any of methods such as solution polymerization, emulsion polymerization, bulk polymerization and suspension polymerization.

The content of a low-molecular weight material is preferably small from the viewpoint of preventing contamination of a clean adherend. In this respect, the weight average molecular weight of the acrylic polymer is preferably 300,000 or more, and more preferably from about 400,000 to 3,000,000.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the pressure-sensitive adhesive. Generally, the crosslinking agent is preferably incorporated in an amount of about 5 parts by weight or less based on 100 parts by weight of the base polymer. The lower limit of the crosslinking agent is preferably 0.1 parts by weight or more. The pressure-sensitive adhesive may be blended not only with the components described above but also with a wide variety of conventionally known additives such as a tackifier, and aging inhibitor, if necessary.

Examples of the ultraviolet curable monomer component to be compounded include such as an urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane dioldi(meth) acrylate. Further, the ultraviolet curable oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the ultraviolet ray curable monomer component and the oligomer component can be appropriately determined to an amount in which the adhesive strength of the pressure-sensitive adhesive layer can be decreased depending on the type of the pressure-sensitive adhesive layer. Generally, it is for example 5 to 500 parts by weight, and preferably about 70 to 150 parts by weight based on 100 parts by weight of the base polymer such as an acrylic polymer constituting the pressure sensitive adhesive.

Further, besides the added type ultraviolet ray curing-type pressure-sensitive adhesive described above, the ultraviolet ray curing-type pressure-sensitive adhesive includes an internal ultraviolet ray curing-type pressure-sensitive adhesive using an acrylic polymer having a radical reactive carbon-carbon double bond in the polymer side chain, in the main chain, or at the end of the main chain as the base polymer. The internal ultraviolet ray curing-type pressure-sensitive adhesives of an internally provided type are preferable because they do not have to contain the oligomer component, etc. that is a low molecular weight component, or most of them do not contain, they can form a pressure-sensitive adhesive layer having a stable layer structure without migrating the oligomer component, etc. in the pressure sensitive adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the radial ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The intrinsic type radial ray curable adhesive may be made only of the above-mentioned base polymer (in particular, the acrylic polymer), which has a carbon-carbon double bond. However, the above-mentioned radial ray curable monomer component or oligomer component may be incorporated into the base polymer to such an extent that properties of the adhesive are not deteriorated. The amount of the radial ray curable oligomer component or the like is usually 30 parts or less by weight, preferably from 0 to 10 parts by weight for 100 parts by weight of the base polymer.

In the case that the radial ray curable adhesive is cured with ultraviolet rays or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl) oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the ultraviolet curing type pressure-sensitive adhesive which is used in the formation of the pressure-sensitive adhesive layer 2 include such as a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include such as polyvalent alcohol ester or oligoester of acryl acid or methacrylic acid and an epoxy or a urethane compound.

The method of forming the part 2a in the pressure-sensitive adhesive layer 2 includes a method of forming the ultraviolet ray curing-type pressure sensitive adhesive layer 2 on the base 1 and then radiating the part 2a with ultraviolet partially and curing. The partial ultraviolet irradiation can be performed through a photo mask in which a pattern is formed which is corresponding to a part 3b, etc. other than the semiconductor wafer pasting part 3a. Further, examples include a method of radiating in a spot manner and curing, etc. The formation of the ultraviolet ray curing-type pressure sensitive adhesive layer 2 can be performed by transferring the pressure-sensitive adhesive layer provided on a separator onto the base 1. The partial ultraviolet curing can be also performed on the ultraviolet ray curing-type pressure sensitive adhesive layer 2 provided on the separator.

In the pressure-sensitive adhesive layer 2 of the dicing die bond film 12, the ultraviolet irradiation may be performed on a part of the pressure-sensitive adhesive layer 2 so that the adhesive strength of the part 2a becomes smaller than the adhesive strength of other parts 2b. That is, the part 2a in which the adhesive strength is decreased can be formed by using those in which the entire or a portion of the part other than the part corresponding to the semiconductor wafer pasting part 3a on at least one face of the base 1 is shaded, forming the ultraviolet ray curing-type pressure sensitive adhesive layer 2 onto this, then radiating ultraviolet, and curing the part corresponding the semiconductor wafer pasting part 3a. The shading material that can be a photo mask on a supporting film can be manufactured by printing, vapor deposition, etc. Accordingly, the dicing die bond film 12 of the present invention can be produced with efficiency.

The thickness of the pressure-sensitive adhesive layer 2 is not particularly limited. However, it is preferably about 1 to 50 μm from the viewpoint of preventing chipping of the chip cut surface, compatibility of fixing and holding of the adhesive layer, and the like. It is preferably 2 to 30 μm, and further preferably 5 to 25 μm.

The tensile storage modulus of the pressure-sensitive adhesive layer 2 at −10 to 30° C. is preferably $1 \times 10^4$ to $1 \times 10^{10}$ Pa. When the tensile storage modulus of the pressure-sensitive adhesive layer 2 is within the above-described value range, the occurrence of chipping can be prevented when the wafer is broken, and the generation of chip fly and shifting can be prevented when a semiconductor chip with a die bond film is picked up.

The breaking elongation rate of the die bond films 3 and 3' at 25° C. before thermal curing is larger than 40% and 500% or less. Because the breaking elongation rate is larger than 40% and 500% or less, the die bond films 3 and 3' can be suitably broken by a tensile force in a step (a chip forming step described later) of breaking the die bond films 3 and 3' by applying a tensile force to the dicing die bond films 10, 12, 20, and 21. Especially, because the breaking elongation rate at 25° C. before thermal curing is larger than 40%, the die bond films 3 and 3' and the semiconductor wafer 4 can be broken at the same time, and the die bond films 3 and 3' and the semiconductor wafer 4 are certainly broken at a line to be divided 4L when the tensile force is applied on the dicing die bond film 12 to obtain the semiconductor chip 5 from the semiconductor wafer 4 by the Stealth Dicing method. The breaking elongation rate is preferably larger than 43% and 500% or less, and more preferably larger than 60% and 450% or less. In the case where the die bond films 3 and 3' are a long film, the breaking elongation rate just satisfies the above-described value rage at least in one direction of a flow direction (MD) and the width direction (TD).

The peeling strength (23° C., peeling angle 180 degree, peeling speed 300 mm/min) of the pressure-sensitive adhesive layer 2 of the dicing film 11 with the die bond film 3 is preferably in a range of 0.02 N/20 mm to 0.2 N/20 mm, more preferably in a range of 0.03 N/20 mm to 0.15 N/20 mm, and further preferably in a range of 0.04 N/20 mm to 0.1 N/20 mm. In the case where the peeling strength is 0.02 N/20 mm or more, the die bond film 3 is prevented from peeling from the dicing film 11 when the tensile force is applied. On the other hand, in the case where the peeling strength is 0.2 N/20 mm or less, peeling of the semiconductor element becomes difficult, and the generation of adhesive residue can be prevented when the semiconductor element is picked up.

On the other hand, the peeling strength (23° C., peeling angle 180 degree, peeling speed 300 mm/min) of the die bond film 3 with the semiconductor wafer is preferably in a range of 0.02 N/20 mm to 0.5 N/20 mm, more preferably in a range of 0.03 N/20 mm to 0.3 N/20 mm, and further preferably in a range of 0.04 N/20 mm to 0.2 N/20 mm.

Further, the tensile storage modulus of the die bond films 3 and 3' at −20 to 30° C. is preferably 0.1 GPa or more and 10 GPa or less, more preferably 0.2 GPa or more and 9.5 GPa or less, and further preferably 0.5 GPa or more and 9 GPa or less. When the tensile storage modulus at −20 to 30° C. is 0.1 GPa or more, the breaking property of the die bond films 3 and 3' improves when it is expanded. Further, when the tensile storage modulus is 10 GPa or less, a laminating property of the die bond films 3 and 3' to the semiconductor wafer improves.

The lamination structure of the die bond film is not especially limited, and examples thereof include a single layer structure of an adhesive layer such as the die bond films 3 and 3' (refer to FIGS. 1 to 3) and a multi-layered structure in which an adhesive layer is formed on one side or both sides of a core member. Examples of the core member include films (such as polyimide film, polyester film, polyethylene terephthalate film, polyethylene naphthalate film, and polycarbonate film); resin substrates which are reinforced with glass fiber or plastic nonwoven finer; silicon substrates; and glass substrates. In the case where the die bond film has a multi-layered structure, the breaking elongation rate, the tensile storage modulus, the loss modulus, and the like are within the above-described range as the entire die bond film having a multi-layered structure.

The adhesive composition constituting the die bond films 3, 3' include those in which a thermoplastic resin is used in combination with a thermosetting resin.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

Examples of the thermoplastic resin include a natural rubber, a butyl rubber, an isoprene rubber, a chloroprene rubber, and ethylene-vinyl acetate copolymer, an ethylene-acrylic acid copolymer, an ethylene-acrylic ester copolymer, a polybutadiene resin, a polycarbonate resin, a thermoplastic polyimide resin, a polyamide resin such as 6-nylon or 6,6-nylon, a phenoxy resin, an acrylic resin, a saturated polyester resin such as PET or PBT, a polyamideimide resin, and a fluororesin. These thermoplastic resins can be used alone or two types or more can be used together. Among these thermoplastic resins, an acrylic resin is especially preferable because it has a small amount of ionic impurities, high heat resistance, and can secure reliability of a semiconductor element.

The acrylic resin is not especially limited, and examples thereof include a polymer (an acrylic copolymer) that is constituted from one type or two types or more of acrylic acid ester or methacrylic acid esters having linear or branched alkyl groups having 30 or less carbon atoms, especially 4 to 18 carbon atoms. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

Among the acrylic resins, an acrylic copolymer is especially preferable due to improvement in cohesive strength. Examples of the acrylic copolymer include a copolymer of ethyl acrylate and methyl methacrylate, a copolymer of acrylic acid and acrylonitrile, and a copolymer of butyl acrylate and acrylonitrile.

Other monomers that form the polymer are not especially limited, and examples thereof include carboxyl group-containing monomers such as acrylic acid, methacrylic acid, carboxyethyl acrylate, carboxypentyl acrylate, itaconic acid, maleic acid, fumaric acid, and crotonic acid, acid anhydride monomers such as maleic anhydride and itaconic anhydride, hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth) acrylate, 12-hydroxylauryl (meth)acrylate, and (4-hydroxymethylcyclohexyl)-methylacrylate, sulfonic acid group-containing monomers such as styrene sulfonate, allyl sulfonate, 2-(meth)acrylamide-2-methylpropane sulfonic acid, (meth)acrylamidepropane sulfonic acid, sulfopropyl (meth)acrylate, and (meth)acryloyloxynaphthalene sulfonic acid, and phosphate group-containing monomers such as 2-hydroyethylacryloyl phosphate.

The mixing ratio of the thermosetting resin is not especially limited as long as it is a ratio at which a thermosetting function of the die bond films 3 and 3' can be exhibited when the films are heated under predetermined conditions. However, it is preferably 5 to 60% by weight and more preferably 10 to 50% by weight.

The glass transition temperature (Tg) of the die bond films 3 and 3' before thermal curing is preferably 25 to 60° C., more preferably 25 to 55° C., and further preferably 25 to 50° C. When the glass transition temperature before thermal curing is 25 to 60° C., the wafer can be laminated favorably. The loss tangent (tan δ) at −30 to 280° C. is measured under the conditions of frequency of 10 Hz and rising temperature speed of 5° C./min using a dynamic viscosity measurement apparatus, and the glass transition temperature is a value that is obtained from a peak value of tan δ.

In order to make the glass transition temperature of the die bond films 3 and 3' before thermal curing be 25 to 60° C., one or more resins having a melting point of 50° C. or more is contained in at least one of the epoxy resins and the phenol resins, for example. Examples of the epoxy resin having a melting point of 50° C. or more include AER-8039 (manufactured by Asahi Kasei Epoxy, melting point 78° C.), BREN-105 (manufactured by Nippon Kayaku Co., Ltd., melting point 64° C.), BREN-S (manufactured by Nippon Kayaku Co., Ltd., melting point 83° C.), CER-3000L (manufactured by Nippon Kayaku Co., Ltd., melting point 90° C.), EHPE-3150 (manufactured by Daicel Chemical Industries, Ltd., melting point 80° C.), EPPN-501HY (manufactured by Nippon Kayaku Co., Ltd., melting point 60° C.), ESN-165M (manufactured by Nippon Steel Chemical Co., Ltd., melting point 76° C.), ESN-175L (manufactured by Nippon Steel Chemical Co., Ltd., melting point 90° C.), ESN-175S (manufactured by Nippon Steel Chemical Co., Ltd., melting point 67° C.), ESN-355 (manufactured by Nippon Steel Chemical Co., Ltd., melting point 55° C.), ESN-375 (manufactured by Nippon Steel Chemical Co., Ltd., melting point 75° C.), ESPD-295 (manufactured by Sumitomo Chemical Co., Ltd., melting point 69° C.), EXA-7335 (manufactured by DIC Corporation, melting point 99° C.), EXA-7337 (manufactured by DIC Corporation, melting point 70° C.), HP-7200H (manufactured by DIC Corporation, melting point 82° C.), TEPIC-SS (manufactured by Nissan Chemical Industries, Ltd., melting point 108° C.), YDC-1312 (manufactured by Tohto Kasei Co., Ltd., melting point 141° C.), YDC-1500 (manufactured by Tohto Kasei Co., Ltd., melting point 101° C.), YL-6121HN (manufactured by Japan Epoxy Resin Co., Ltd., melting point 130° C.), YSLV-120TE (manufactured by Tohto Kasei Co., Ltd., melting point 113° C.), YSLV-80XY (manufactured by Tohto Kasei Co., Ltd., melting point 80° C.), YX-4000H (manufactured by Japan Epoxy Resin Co., Ltd., melting point 105° C.), YX-4000K (manufactured by Japan Epoxy Resin Co., Ltd., melting point 107° C.), ZX-650 (manufactured by Tohto Kasei Co., Ltd., melting point 85° C.), Epicoat 1001 (manufactured by Japan Epoxy Resin Co., Ltd., melting point 64° C.), Epicoat 1002 (manufactured by Japan Epoxy Resin Co., Ltd., melting point 78° C.), Epicoat 1003 (manufactured by Japan Epoxy Resin Co., Ltd., melting point 89° C.), Epicoat 1004 (manufactured by Japan Epoxy Resin Co., Ltd., melting point 97° C.), and Epicoat 1006FS (manufactured by Japan Epoxy Resin Co., Ltd., melting point 112° C.). Among these, AER-8039 (manufactured by Asahi Kasei Epoxy, melting point 78° C.), BREN-105 (manufactured by Nippon Kayaku Co., Ltd., melting point 64° C.), BREN-S (manufactured by Nippon Kayaku Co., Ltd., melting point 83° C.), CER-3000L (manufactured by Nippon Kayaku Co., Ltd., melting point 90° C.), EHPE-3150 (manufactured by Daicel Chemical Industries, Ltd., melting point 80° C.), EPPN-501HY (manufactured by Nippon Kayaku Co., Ltd., melting point 60° C.), ESN-165M (manufactured by Nippon Steel Chemical Co., Ltd., melting point 76° C.), ESN-175L (manufactured by Nippon Steel Chemical Co., Ltd., melting point 90° C.), ESN-175S (manufactured by Nippon Steel Chemical Co., Ltd., melting point 67° C.), ESN-355 (manufactured by Nippon Steel Chemical Co., Ltd., melting point 55° C.), ESN-375 (manufactured by Nippon Steel Chemical Co., Ltd., melting point 75° C.), ESPD-295 (manufactured by Sumitomo Chemical Co., Ltd., melting point 69° C.), EXA-7335 (manufactured by DIC Corporation, melting point 99° C.), EXA-7337 (manufactured by DIC Corporation, melting point 70° C.), HP-7200H (manufactured by DIC Corporation, melting point 82° C.), YSLV-80XY (manufactured by Tohto Kasei Co., Ltd., melting point 80° C.), ZX-650 (manufactured by Tohto Kasei Co., Ltd., melting point 85° C.), Epicoat 1001 (manufactured by Japan Epoxy Resin Co., Ltd., melting point 64° C.), Epicoat 1002 (manufactured by Japan Epoxy Resin Co., Ltd., melting point 78° C.), Epicoat 1003 (manufactured by Japan Epoxy Resin Co., Ltd., melting point 89° C.), and Epicoat 1004 (manufactured by Japan Epoxy Resin Co., Ltd., melting point 97° C.) are preferable. Since the melting point of these epoxy resins is not too high (less than 100° C.), the wafer laminating property is good when these epoxy resins are used in the die bond film.

Examples of the phenol resin having a melting point of 50° C. or more include DL-65 (manufactured by Meiwa Plastic Industries, Ltd., melting point 65° C.), DL-92 (manufactured by Meiwa Plastic Industries, Ltd., melting point 92° C.), DPP-L (manufactured by Nippon Oil Corporation, melting point 100° C.), GS-180 (manufactured by Gunei Chemical Industry Co., Ltd., melting point 83° C.), GS-200 (manufactured by Gunei Chemical Industry Co., Ltd., melting point 100° C.), H-1 (manufactured by Meiwa Plastic Industries, Ltd., melting point 79° C.), H-4 (manufactured by Meiwa Plastic Industries, Ltd., melting point 71° C.), HE-100C-15 (manufactured by Sumitomo Chemical Co., Ltd., melting point 73° C.), HE-510-05 (manufactured by Sumitomo Chemical Co., Ltd., melting point 75° C.), HF-1 (manufactured by Meiwa Plastic Industries, Ltd., melting point 84° C.), HF-3 (manufactured by Meiwa Plastic Industries, Ltd., melting point 96° C.), MEH-7500 (manufactured by Meiwa Plastic Industries, Ltd., melting point 111° C.), MEH-7500-3S (manufactured by Meiwa Plastic Industries, Ltd., melting point 83° C.), MEH-7800-3L (manufactured by Meiwa Plastic Industries, Ltd., melting point 72° C.), MEH-7851 (manufactured by Meiwa Plastic Industries, Ltd., melting point 78° C.), MEH-7851-3H (manufactured by Meiwa Plastic Industries, Ltd., melting point 105° C.), MEH-7851-4H (manufactured by Meiwa Plastic Industries, Ltd., melting point 130° C.), MEH-7851S (manufactured by Meiwa Plastic Industries, Ltd., melting point 73° C.), P-1000 (manufactured by Arakawa Chemical Industries, Ltd., melting point 63° C.), P-180 (manufactured by Arakawa Chemical Industries, Ltd., melting point 83° C.), P-200 (manufactured by Arakawa Chemical Industries, Ltd., melting point 100° C.), VR-8210 (manufactured by Mitsui Chemicals, Inc., melting point 60° C.), XLC-3L (manufactured by Mitsui Chemicals, Inc., melting point 70° C.), XLC-4L (manufactured by Mitsui Chemicals, Inc., melting point 62° C.), and XLC-LL (manufactured by Mitsui Chemicals, Inc., melting point 75° C.). Among these, DL-65 (manufactured by Meiwa Plastic Industries, Ltd., melting point 65° C.), DL-92 (manufactured by Meiwa Plastic Industries, Ltd., melting point 92° C.), GS-180 (manufactured by Gunei Chemical Industry Co., Ltd., melting point 83° C.), H-1 (manufactured by Meiwa Plastic Industries, Ltd., melting point 79° C.), H-4 (manufactured by Meiwa Plastic Industries, Ltd., melting point 71° C.), HE-100C-15 (manufactured by Sumitomo Chemical Co., Ltd., melting point 73° C.), HE-510-05 (manufactured by Sumitomo Chemical Co., Ltd., melting point 75° C.), HF-1 (manufactured by Meiwa Plastic Industries, Ltd., melting point 84° C.), HF-3 (manufactured by Meiwa Plastic Industries, Ltd., melting point 96° C.), MEH-7500-35 (manufactured by Meiwa Plastic Industries, Ltd., melting point 83° C.), MEH-7800-3L (manufactured by Meiwa Plastic Industries, Ltd., melting point 72° C.), MEH-7851 (manufactured by Meiwa Plastic Industries, Ltd., melting point 78° C.), MEH-78515 (manufactured by Meiwa Plastic Industries, Ltd., melting point 73° C.), P-1000 (manufactured by Arakawa Chemical Industries, Ltd., melting point 63° C.), P-180 (manufactured by Arakawa Chemical Industries, Ltd., melting point 83° C.), VR-8210 (manufactured by Mitsui Chemicals, Inc., melting point 60° C.), XLC-3L (manufactured by Mitsui Chemicals, Inc., melting point 70° C.), XLC-4L (manufactured by Mitsui Chemicals, Inc., melting point 62° C.), and XLC-LL (manufactured by Mitsui Chemicals, Inc., melting point 75° C.) are preferable. Since the melting point of these phenol resins is not too high (less than 100° C.), the wafer laminating property is good when these phenol resins are used in the die bond film.

The die bond films 3 and 3' preferably contain an epoxy resin, a phenol resin, and an acrylic resin, and when the total weight of the epoxy resin and the phenol resin is X and the weight of the acrylic resin is Y, X/(X+Y) is preferably 0.3 or more and less than 0.9, more preferably 0.35 or more and less than 0.85, and further preferably 0.4 or more and less than 0.8. The die bond films 3 and 3' become easier to be broken as the contents of the epoxy resin and the phenol resin increase. However, the tackiness to the semiconductor wafer 4 decreases. Further, the die bond films 3 and 3' become difficult to be cracked and has a good workability in bonding or handling as the content of the acrylic resin increases. However, they become difficult to be broken. Thus, by making X/(X+Y) be 0.3 or more, it becomes easier to break the die bond films 3 and 3' and the semiconductor wafer 4 at the same time when the semiconductor element 5 is obtained from the semiconductor wafer 4 by the Stealth Dicing method. Further, by making X/(X+Y) be less than 0.9, a good workability can be obtained.

In order to crosslink the die bond film 3, 3' of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art.

Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

A filler can be appropriately mixed into the die bond films 3, 3' according to their use. By mixing the filler, electroconductivity can be given, thermal conductivity can be improved, and the elastic modulus can be adjusted. Examples of the filler include an inorganic filler and an organic filler. However, an inorganic filler is preferable from the viewpoint of improving handling property, improving thermal conductivity, adjusting melt viscosity, and giving thixotropy. The inorganic filler is not especially limited, and examples thereof include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whiskers, boron nitride, crystalline silica, and amorphous silica. These can be used alone or two types or more can be used together. From the viewpoint of improving thermal conductivity, aluminum oxide, aluminum nitride, boron nitride, crystalline silica, and amorphous silica are preferable. From the viewpoint of obtaining a good balance among the above-described characteristics, crystalline silica and amorphous silica are preferable. Further, an electroconductive substance (electroconductive filler) may be used as the inorganic filler for the purpose of giving electroconductivity and improving the thermal conductivity. Examples of the electroconductive filler include spherical-shaped, needle-shaped, or flake-shaped metal powders of silver, aluminum, gold, copper, nickel, and electroconductive alloys, metal oxides such as alumina, amorphous carbon black, and graphite.

The average particle size of the filler is preferably 0.005 to 10 μm, and more preferably 0.005 to 1 μm. With the average particle size of the filler being 0.005 μm or more, the wettability and the tackiness to the adherend can be improved. With the particle size being 10 μm or less, the effect of the filler added to give the above-described characteristics can be made sufficient, and heat resistance can be secured. The value of the average particle size of the filler is obtained with a luminous intensity type particle size distribution meter (manufactured by HORIBA, Ltd., device name: LA-910), for example.

When the total weight of the epoxy resin, the phenol resin, and the acrylic resin is A and the weight of the filler is B, B/(A+B) of the adhesive layer is preferably 0.1 or more and 0.7 or less, more preferably 0.1 or more and 0.65 or less, and further preferably 0.1 or more and 0.6 or less. With this value being 0.7 or less, the tensile storage modulus is prevented from becoming large, and wettability and tackiness to the adherend can be improved. With this value being 0.1 or more, the die bond film can be suitably broken with a tensile force.

Moreover, other additives besides the filler can be appropriately mixed into the die bond films 3 and 3' as necessary. Examples thereof include a flame retardant, a silane coupling agent, and an ion trapping agent. Examples of the flame retardant include antimony trioxide, antimony pentaoxide, and brominated epoxy resin. These may be used alone or in combination of two or more thereof. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof. Examples of the ion trapping agent include hydrotalcite and bismuth hydroxide. These may be used alone or in combination of two or more thereof.

The thickness of the die bond films 3 and 3' (the total thickness in the case of a laminated body) is not especially limited. However, it can be selected from a range of 1 to 200 μm, for example. It is preferably selected from a range of 5 to 100 μm, and more preferably 10 to 80 μm.

The die bond films 3, 3' of the dicing die bond films 10, 11 are preferably protected by a separator (not shown). The separator has a function as a protecting material that protects the die bond films 3, 3' until they are practically used. Further, the separator can be used as a supporting base when transferring the die bond films 3, 3' to the pressure-sensitive adhesive layer 2. The separator is peeled when pasting a workpiece onto the die bond films 3, 3' of the dicing die bond film. Polyethylenetelephthalate (PET), polyethylene, polypropylene, a plastic film, a paper, etc. whose surface is coated with a peeling agent such as a fluorine based peeling agent and a long chain alkylacrylate based peeling agent can be also used as the separator.

The dicing die bond films 10, 11 according to the present embodiment are produced, for example, by the following procedure.

First, the base 1 can be formed by a conventionally known film-forming method. The film-forming method includes, for example, a calendar film-forming method, a casting method in an organic solvent, an inflation extrusion method in a closed system, a T-die extrusion method, a co-extrusion method, and a dry lamination method.

Next, a pressure-sensitive adhesive composition solution is applied on the base 1 to form a coated film and the coated film is dried under predetermined conditions (optionally crosslinked with heating) to form the pressure-sensitive adhesive layer 2. Examples of the application method include, but are not limited to, roll coating, screen coating and gravure coating methods. Drying is conducted under the drying conditions, for example, the drying temperature within a range from 80 to 150° C. and the drying time within a range from 0.5 to 5 minutes. The pressure-sensitive adhesive layer 2 may also be formed by applying a pressure-sensitive adhesive composition on a separator to form a coated film and drying the coated film under the drying conditions. Then, the pressure-sensitive adhesive layer 2 is laminated on the base 1 together with the separator. Thus, the dicing film 11 is produced.

The die bond films 3, 3' are produced, for example, by the following procedure. First, an adhesive composition solution as a material for forming the die bond films 3, 3' is produced. As described above, the adhesive composition solution is blended with the adhesive composition, a filler, and various additives.

Next, the adhesive composition solution is applied on a substrate separator to form a coated film having a predetermined thickness and the coated film is dried under predetermined conditions to form an adhesive layer. Examples of the application method include, but are not limited to, roll coating, screen coating and gravure coating methods. Drying is conducted under the drying conditions, for example, the drying temperature within a range from 70 to 160° C. and the drying time within a range from 1 to 5 minutes. An adhesive layer may also be formed by applying a pressure-sensitive adhesive composition solution on a separator to form a coated film and drying the coated film under the drying conditions. On the substrate separator, the adhesive layer is layered together with a separator.

Subsequently, each separator is peeled from the dicing film 11 and the adhesive layer and both are laminated to each other so that the adhesive layer and the pressure-sensitive adhesive layer serve as a laminating surface. Lamination is conducted, for example, by contact bonding. At this time, the lamination temperature is not particularly limited and is, for example, preferably from 30 to 50° C., and more preferably from 35 to 45° C. The linear pressure is not particularly limited and is, for example, from 0.1 to 20 kgf/cm, and more preferably from 1 to 10 kgf/cm. Then, the substrate separator on the adhesive layer is peeled to obtain the dicing die bond film according to the present embodiment.

(Method of Manufacturing a Semiconductor Device)

Next, a method of manufacturing a semiconductor device using the dicing die bond film 10 is explained referring to FIGS. 4 to 9. FIGS. 4 to 7 are cross-sectional schematic diagrams for explaining one method of manufacturing a semiconductor device according to the present embodiment. First, the line to be divided 4L of the semiconductor wafer 4 is irradiated with a laser beam to form a modified region on the line to be divided 4L. The present method is a method of forming a reformed region inside the semiconductor wafer by ablation caused by multi-photon absorption by focusing condensing points on the inside of the semiconductor wafer and irradiating the semiconductor water with a laser beam along the lattice-shaped scheduled dividing lines. The irradiation conditions of the laser beam are appropriately adjusted within the following ranges.

<Laser Beam Irradiation Conditions>
(A) Laser Beam
Laser Beam Source Semiconductor laser excitation Nd:YAG laser
Wavelength 1064 nm
Sectional Area of Laser Spot $3.14 \times 10^{-8}$ cm$^2$
Laser Oscillation Form Q switch pulse
Repetition Frequency 100 kHz or less
Pulse Width 1 μs or less
Output 1 mJ or less
Quality of Laser Beam TEM00
Polarization Characteristic Linear polarization
(B) Beam Collecting Lens
Magnification 100 times or less
NA 0.55
Transmittance to Laser Beam Wavelength 100% or less
(C) Movement Speed of the Stage on which Semiconductor Substrate is Loaded 280 mm/sec or less A detailed explanation of the method of forming a reformed region on the scheduled dividing lines 4L by irradiating the semiconductor wafer with a laser beam is omitted because it is specifically described in Japanese Patent No. 3408805 and Japanese Patent Application Laid-Open No. 2003-338567.

Figure 5:
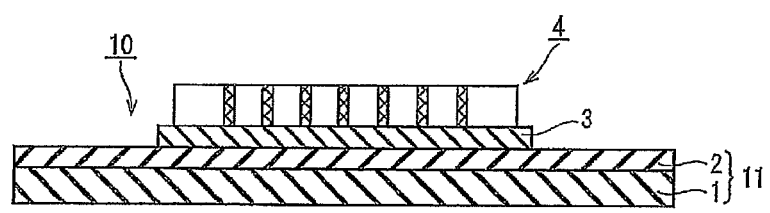
FIG. 5 is a schematic sectional view for explaining the method of manufacturing a semiconductor device according to the present embodiment.

Next, as shown in FIG. 5, the semiconductor wafer 4 after the modified region is formed is pressed on the die bond film, and this is adhered and held to be fixed (a mounting step). This step is performed while pressing the wafer with a pressing means such as a press bonding roll. The bonding temperature during mounting is not especially limited, however, it is preferably in the range of 40 to 80° C. This is because warping of the semiconductor wafer 4 can be effectively prevented and the influence of expansion and contraction of the dicing die bond film can be reduced.

Figure 6:
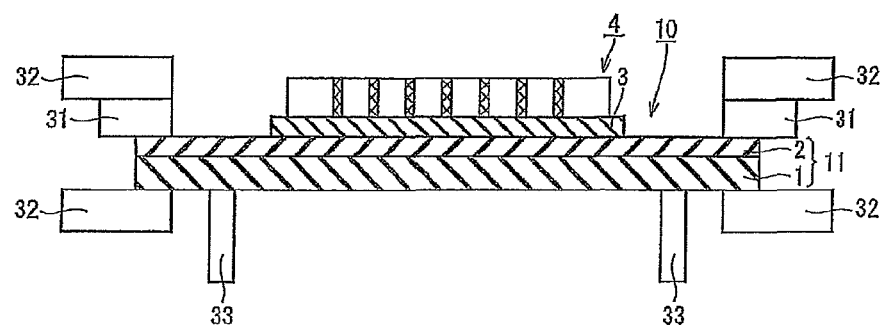
FIGS. 6A and 6B are schematic sectional views for explaining the method of manufacturing a semiconductor device according to the present embodiment.
Figure 6:
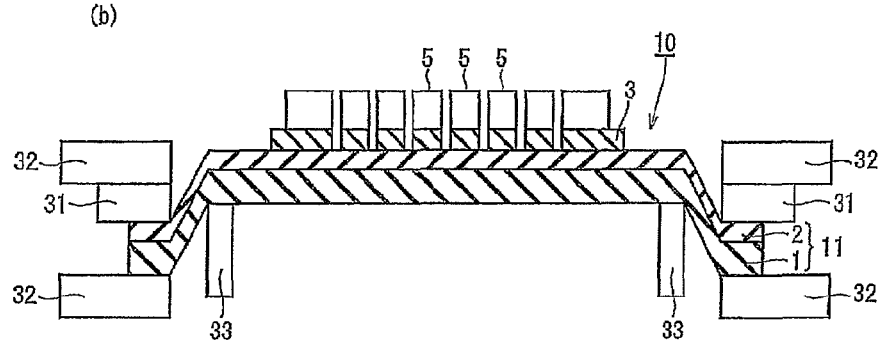

Next, the tensile force is applied to the dicing die bond film 10 to break the semiconductor wafer 4 and the die bond film 3 at the line to be divided 4L, and the semiconductor chip 5 is formed (a chip forming step). For example, a commercially available wafer expansion machine can be used in the present step. Specifically, as shown in FIGS. 1 (b) and 6 (a), the dicing ring 31 is bonded to the ring bonding part 13 of the dicing film 11 of the dicing die bond film 10 in which the semiconductor wafer 4 is bonded, and then the obtained dicing ring is fixed in the wafer expansion machine 32. Next, as shown in FIG. 6 (b), the push-up jig 33 is elevated to apply a tension to the dicing die bond film 10.

The chip forming step can be performed under a condition of −50 to 10° C., more preferably −20 to 30° C., and further preferably −10 to 25° C.

Further, in the chip forming step, the expansion speed (the speed of the push-up part elevation) is preferably 100 to 400 mm/sec, more preferably 100 to 350 mm/sec, and further preferably 100 to 300 mm/sec. When the expansion speed is 100 mm/sec or more, the semiconductor wafer 4 and the die bond film 3 can be easily broken substantially at the same time. When the expansion speed is 400 mm/sec or less, the breaking of the dicing film 11 can be prevented.

The expansion amount is preferably 6 to 12% in the chip forming step. The expansion amount is appropriately adjusted within the above-described value range depending on the size of the chip to be formed. In the present invention, the expansion amount is a value (%) of the surface area that is increased by the expansion as the surface area of the dicing film before expansion being 100%. When the expansion amount is 6% or more, the semiconductor wafer 4 and the die bond film 3 can be easily broken. When the expansion amount is 12% or less, a breaking of the dicing film 11 can be prevented.

As described above, cracks can be generated in the thickness direction of the semiconductor wafer 4 with the reformed region of the semiconductor wafer 4 as a starting point, the die bond film 3' that is closely attached to the semiconductor wafer 4 can be broken by applying a tensile force to the dicing die bond film 10, and the semiconductor chip 5 with the die bond film 3' can be obtained.

Next, pickup of the semiconductor chip 5 is performed to peel off the semiconductor chip 5 that is adhered and fixed onto the dicing die bond film 10 (the pickup step). The method of picking up is not particularly limited, and conventionally known various methods can be adopted. Examples include a method of pushing up the individual semiconductor chip 5 from the dicing die bond film 10 side with a needle and picking up the pushed semiconductor chip 5 with a picking-up apparatus.

In the case where the pressure-sensitive adhesive layer 2 is an ultraviolet curing type, the pickup is performed after the pressure-sensitive adhesive layer 2 is irradiated with an ultraviolet ray. Accordingly, the adhesive strength of the pressure-sensitive adhesive layer 2 to the die bond film 3a decreases, and the peeling of the semiconductor chip 5 becomes easy. As a result, picking up becomes possible without damaging the semiconductor chip 5. The condition such as irradiation intensity and irradiation time when irradiating an ultraviolet ray is not particularly limited, and it may be appropriately set depending on necessity. Further, the light source as described above can be used as a light source used in the ultraviolet irradiation.

Figure 7:
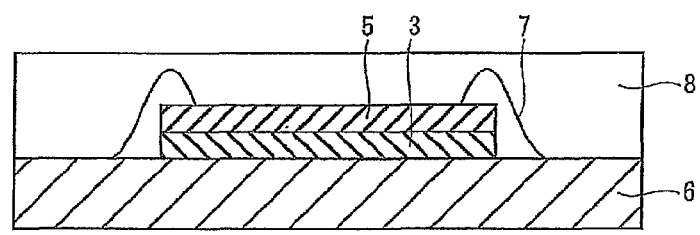
FIG. 7 is a schematic sectional view for explaining the method of manufacturing a semiconductor device according to the present embodiment.

Next, the semiconductor chip 5 that is picked up is die-bonded to the adherend 6 through the die bond film 3 as shown in FIG. 7 (the temporary fixing step). Examples of the adherend 6 include such as a lead frame, a TAB film, a substrate, and a semiconductor chip separately produced. The adherend 6 may be a deformable adherend that are easily deformed, or may be a non-deformable adherend (a semiconductor wafer, etc.) that is difficult to deform, for example.

A conventionally known substrate can be used as the substrate. Further, a metal lead frame such as a Cu lead frame and a 42 Alloy lead frame and an organic substrate composed of glass epoxy, BT (bismaleimide-triazine), and polyimide can be used as the lead frame. However, the present invention is not limited to this, and includes a circuit substrate that can be used by mounting a semiconductor element and electrically connecting with the semiconductor element.

The shear adhering strength to the adherend 6 at 25° C. during the temporary fixing of the die bond film 3 is preferably 0.2 MPa or more, and more preferably 0.2 to 10 MPa. When the shear adhering strength of the die bond film 3 is at least 0.2 MPa, shear deformation rarely occurs at the adhering surface between the die bond film 3 and the semiconductor chip 5 or the adherend 6 during the wire bonding step due to ultrasonic vibration and heating in this step. That is, the semiconductor element rarely moves due to the ultrasonic vibration during the wire bonding, and with this, the success rate of the wire bonding can be prevented from decreasing. The shear adhering strength to the adherend 6 at 175° C. during the temporary fixing of the die bond film 3' is preferably 0.01 MPa or more, and more preferably 0.01 to 5 MPa.

Next, wire bonding is performed to electrically connect a tip of a terminal part (inner lead) of the adherend 6 and an electrode pad (not shown) on the semiconductor chip 5 with a bonding wire 7 (the wire bonding step). The bonding wires 7 may be, for example, gold wires, aluminum wires, or copper wires. The temperature when the wire bonding is performed is from 80 to 250° C., preferably from 80 to 220° C. The heating time is from several seconds to several minutes. The connection of the wires is performed by using a combination of vibration energy based on ultrasonic waves with compression energy based on the application of pressure in the state that the wires are heated to a temperature in the above-mentioned range. The present step can be conducted without thermal setting of the die bond film 3. In the process of the step, the semiconductor chip 5 and the adherend 6 are not fixed to each other by the die bond film 3.

Next, the semiconductor chip 5 is sealed with the sealing resin 8 (the sealing step). The present step is performed by molding the sealing resin with a mold or die. The sealing resin 8 may be, for example, an epoxy resin. The heating for the resin-sealing is performed usually at 175° C. for 60 to 90 seconds. In the this invention, however, the heating is not limited to this, and may be performed, for example at 165 to 185° C. for several minutes. In such a way, the sealing resin is cured and further the semiconductor chip 5 and the adherend 6 are set to each other through the adhesive sheet 3a. In short, even if the below mentioned post-curing step, which will be detailed later, is not performed in this invention, the sticking/fixing based on the adhesive sheet 3a can be attained in the present step so that the number of the producing steps can be reduced and the term for producing the semiconductor device can be shortened.

In the post-curing step, the sealing resin 8, which is not sufficiently cured in the sealing step, is completely cured. Even if the die bond film 3 is not completely cured in the step of sealing, the die bond film 3 and sealing resin 8 can be completely cured in the present step. The heating temperature in the present step is varied dependently on the kind of the sealing resin, and is, for example, in the range of 165 to 185° C. The heating time is from about 0.5 to 8 hours.

The case of temporarily fixing the semiconductor chip 5 with the die bond film 3 to the adherend 6 and then performing the wire bonding step without completely thermally curing the die bond film 3 is explained in the above-described embodiment. However, a normal die bonding step of temporarily fixing the semiconductor chip 5 with the die bond film 3 to the adherend 6, thermally curing the die bond film 3, and then performing the wire bonding step may be performed in the present invention. In this case, the die bond film 3 after the thermal setting preferably has a shear adhering strength at 175° C. of 0.01 MPa or more, and more preferably 0.01 to 5 MPa. With the shear adhering strength at 175° C. after the thermal setting being 0.01 MPa or more, the shear deformation at the adhering surface between the die bond film 3 and the semiconductor chip 5 or the adherend 6 due to ultrasonic vibration and heating during the wire bonding step can be prevented from occurring.

A method of manufacturing a semiconductor device is explained below in which the grooves are formed on the surface of the semiconductor wafer, and then a step of performing the backside grinding is adopted.

Figure 8:
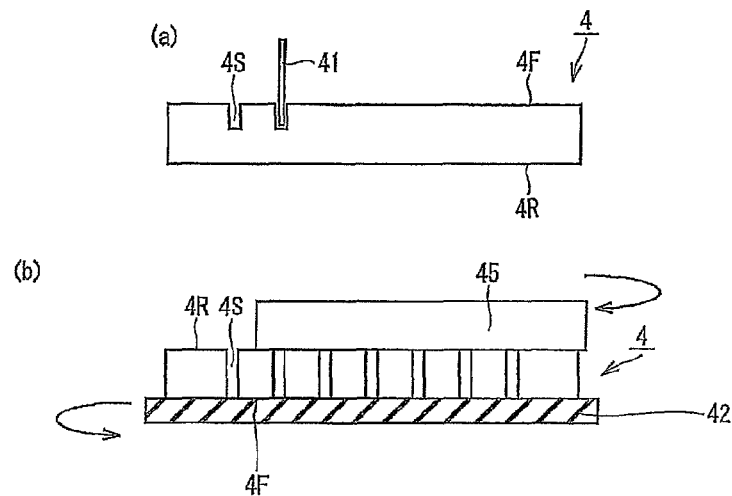
FIGS. 8A and 8B are schematic sectional views for explaining another method of manufacturing a semiconductor device according to the present embodiment.
Figure 9:
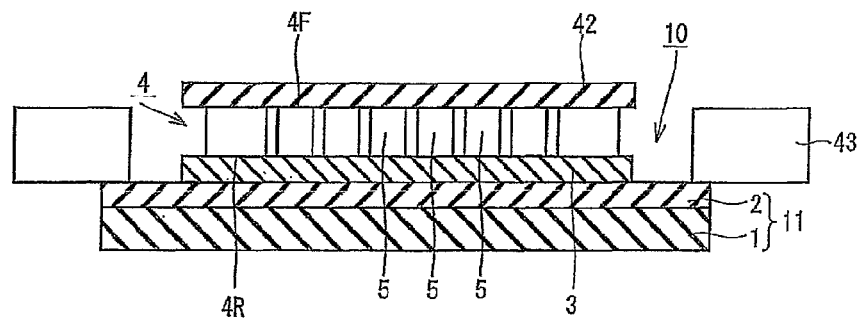
FIG. 9 is a schematic sectional view for explaining the different method of manufacturing a semiconductor device according to the present embodiment.

FIGS. 8 and 9 are schematic sectional views for explaining another method of manufacturing a semiconductor device according to the present embodiment. First, a groove 4S that does not reach backside 4R is formed on a surface 4F of the semiconductor wafer 4 with a rotary blade 41 as shown in FIG. 8A. The semiconductor wafer 4 is supported by a supporting base that is not shown during the formation of the groove 4S. The depth of the groove 4S can be appropriately set depending on the thickness of the semiconductor wafer 4 and the expansion condition. Next, the semiconductor wafer 4 is made to be supported by a protective base 42 so that the surface 4F is brought into contact with itself as shown in FIG. 8B. Then, the groove 4S is exposed from the backside 4R by performing backside grinding with a grinding wheel 45. A conventionally known bonding apparatus can be used to bond the protective base 42 onto the semiconductor wafer, and a conventionally known grinding apparatus can be used for the backside grinding.

Next, as shown in FIG. 9, the semiconductor wafer 4 where the grooves 4S are exposed is pressed on the dicing die bond film 10, and this is adhered and held to be fixed (a prefixing step). Then, a protective base 42 is peeled, and a tension is applied to the dicing die bond film 10 by a wafer expansion machine 32. With this, the die bond film 3 is broken, and the semiconductor chip 5 is formed (a chip forming step). The temperature, the expansion speed, and the expansion amount in the chip forming step is the same as the case of irradiating with a laser beam to form the modified region on the line to be divided 4L. The explanation of the following steps is omitted because they are the same as the case of irradiating with a laser beam to form the modified region on the line to be divided 4L.

Below, preferred examples of the present invention are explained in detail. However, materials, addition amounts, and the like described in these examples are not intended to limit the scope of the present invention, and are only examples for explanation as long as there is no description of limitation in particular.

Die bond films A to F were produced as follows.
<Production of the Die Bond Film>
(Die Bond Film A)

The following (a) to (d) were dissolved in methylethylketone, and an adhesive composition solution having a concentration of 23.6% by weight was obtained.

(a) Epoxy resin (Epicoat 1004 manufactured by Japan Epoxy Resins Co., Ltd., melting point: 97° C.) 11 parts by weight (b) Phenol resin (Milex XLC-4L manufactured by Mitsui Chemicals, Inc., melting point: 62° C.) 13 parts by weight (c) Acrylic ester polymer having ethyl acrylate-methyl methacrylate as a main component (WS-023 manufactured by Nagase ChemteX Corporation) 100 parts by weight (d) Spherical silica (SO-25R manufactured by Admatechs Co., Ltd.) 1287 parts by weight This adhesive composition solution was applied on a release-treated film (peel liner) composed of a 50 μm thick polyethylene terephthalate film subjected to a silicone release treatment and then dried at 130° C. for 2 minutes to produce a 25 µm thick die bond film A.

(Die Bond Film B)

The following (a) to (d) were dissolved in methylethylketone, and an adhesive composition solution having a concentration of 23.6% by weight was obtained.

(a) Epoxy resin (Epicoat 1004 manufactured by Japan Epoxy Resins Co., Ltd.) 113 parts by weight (b) Phenol resin (Milex XLC-4L manufactured by Mitsui Chemicals, Inc.) 121 parts by weight (c) Acrylic ester polymer having ethyl acrylate-methyl methacrylate as a main component (manufactured by Nagase ChemteX Corporation, WS-023) 100 parts by weight (d) Spherical silica (manufactured by Admatechs Co., Ltd., SO-25R) 222 parts by weight This adhesive composition solution was applied on a release-treated film (peel liner) composed of a 50 µm thick polyethylene terephthalate film subjected to a silicone release treatment and then dried at 130° C. for 2 minutes to produce a 25 µm thick die bond film B.

(Die Bond Film C)

The following (a) to (d) were dissolved in methylethylketone, and an adhesive composition solution having a concentration of 23.6% by weight was obtained.

(a) Epoxy resin (Epicoat 1004 manufactured by Japan Epoxy Resins Co., Ltd.) 113 parts by weight (b) Phenol resin (Milex XLC-4L manufactured by Mitsui Chemicals, Inc.) 121 parts by weight (c) Acrylic ester polymer having ethyl acrylate-methyl methacrylate as a main component (WS-023 manufactured by Nagase ChemteX Corporation) 100 parts by weight (d) Spherical silica (SO-25R manufactured by Admatechs Co., Ltd.) 37 parts by weight This adhesive composition solution was applied on a release-treated film (peel liner) composed of a 50 µm thick polyethylene terephthalate film subjected to a silicone release treatment and then dried at 130° C. for 2 minutes to produce a 25 µm thick die bond film C.

(Die Bond Film D)

The following (a) to (d) were dissolved in methylethylketone, and an adhesive composition solution having a concentration of 23.6% by weight was obtained.

(a) Epoxy resin (Epicoat 1001 manufactured by Japan Epoxy Resins Co., Ltd.) 32 parts by weight (b) Phenol resin (MEH 7851 manufactured by Mitsui Chemicals, Inc.) 34 parts by weight (c) Acrylic ester polymer having ethyl acrylate-methyl methacrylate as a main component (WS-023 manufactured by Nagase ChemteX Corporation) 100 parts by weight (d) Spherical silica (SO-25R manufactured by Admatechs Co., Ltd.) 110 parts by weight This adhesive composition solution was applied on a release-treated film (peel liner) composed of a 50 µm thick polyethylene terephthalate film subjected to a silicone release treatment and then dried at 130° C. for 2 minutes to produce a 25 µm thick die bond film D.

(Die Bond Film E)

The following (a) to (d) were dissolved in methylethylketone, and an adhesive composition solution having a concentration of 23.6% by weight was obtained.

(a) Epoxy resin (Epicoat 1001 manufactured by Japan Epoxy Resins Co., Ltd.) 32 parts by weight (b) Phenol resin (Milex XLC-4L manufactured by Mitsui Chemicals, Inc.) 34 parts by weight (c) Acrylic ester polymer having ethyl acrylate-methyl methacrylate as a main component (WS-023 manufactured by Nagase ChemteX Corporation) 100 parts by weight (d) Spherical silica (SO-25R manufactured by Admatechs Co., Ltd.) 18 parts by weight This adhesive composition solution was applied on a release-treated film (peel liner) composed of a 50 µm thick polyethylene terephthalate film subjected to a silicone release treatment and then dried at 130° C. for 2 minutes to produce a 25 µm thick die bond film E.

(Die Bond Film F)

The following (a) to (d) were dissolved in methylethylketone, and an adhesive composition solution having a concentration of 23.6% by weight was obtained.

(a) Epoxy resin (Epicoat 827 manufactured by Japan Epoxy Resins Co., Ltd.) 11 parts by weight (b) Phenol resin (Milex XLC-4L manufactured by Mitsui Chemicals, Inc.) 13 parts by weight (c) Acrylic ester polymer having ethyl acrylate-methyl methacrylate as a main component (WS-023 manufactured by Nagase ChemteX Corporation) 100 parts by weight (d) Spherical silica (SO-25R manufactured by Admatechs Co., Ltd.) 7 parts by weight This adhesive composition solution was applied on a release-treated film (peel liner) composed of a 50 µm thick polyethylene terephthalate film subjected to a silicone release treatment and then dried at 130° C. for 2 minutes to produce a 25 µm thick die bond film F.

Next, bases A to J for a dicing film were prepared as follows.

<Preparation of the Base for a Dicing Film>

(Base A)

An olefin based multilayered film (thickness of 100 µm, an emboss treatment was performed on the back face (the LLDPE layer side)) was prepared in which a layer (thickness of 80 µm) consisting of a mixed resin of polypropylene and an ethylene-propylene rubber and a layer (thickness of 20 µm) consisting of LLDPE (linear chain low density polyethylene) were laminated. A raw PET film ("Teijin Tetoron Film" manufactured by Teijin DuPont Films Japan Limited, thickness of 16 µm) was bonded to apart corresponding to the contact part of the olefin based multilayered film from the surface.

(Base B)

A multilayered film (thickness of 150 µm, an emboss treatment was performed on the back face (the PE layer side)) was prepared in which a layer (thickness of 105 µm) consisting of SEBS (a styrene based elastomer) and MBS (a copolymer resin of methacrylic ester-butadiene-styrene), a layer (thickness of 30 µm) consisting of SEBS, and a layer (thickness of 15 µm) consisting of PE (polyethylene) were laminated in this order.

(Base C)

A vinyl chloride film ("Artoron #2800" manufactured by Mitsubishi Plastics, Inc., thickness of 100 µm) was prepared in which the emboss treatment was performed on the back face.

(Base D)

A vinyl chloride film ("Artoron #2800" manufactured by Mitsubishi Plastics, Inc., thickness of 100 µm) was prepared (no emboss treatment).

(Base E)

A multilayered film (thickness of 150 µm, an emboss treatment was performed on the back face (the PE layer side)) was prepared in which a layer (thickness of 50 µm) consisting of SEBS (a styrene based elastomer) and MBS (a copolymer resin of methacrylic ester-butadiene-styrene), a layer (thickness of 85 μm) consisting of SEBS, and a layer (thickness of 15 μm) consisting of PE (polyethylene) were laminated in this order.

(Base F)

A LDPE (low density polyethylene) film ("NO Film" manufactured by Nitto Denko Corporation, thickness of 120 μm, an emboss treatment was performed on the back face) was prepared.

(Base G)

A vinyl chloride film ("Artoron #3300" manufactured by Mitsubishi Plastics, Inc., thickness of 100 μm) was prepared in which the emboss treatment was performed on the back face.

(Base H)

The base A (the olefin based multilayered film) was prepared. A PET film ("BT-315" manufactured by Nitto Denko Corporation, thickness of 70 μm) was bonded to a part corresponding to the contact part of the olefin based multilayered film from the back face.

(Base I)

A vinyl chloride film ("Artoron #2800" manufactured by Mitsubishi Plastics, Inc., thickness of 100 μm) was prepared in which an emboss treatment was performed on the back face. A PET film ("BT-315" manufactured by Nitto Denko Corporation, thickness of 70 μm) was bonded to a part corresponding to the wafer bonding part of the vinyl chloride film from the back face.

(Base J)

The base A (the olefin based multilayered film) was prepared. A PET film ("Teijin Tetoron Film" manufactured by Teijin DuPont Films Japan Limited, thickness of 16 μm) in which a silicone treatment was performed on one surface was bonded to a part corresponding to the contact part of the olefin based multilayered film from the back face so that the silicone treated surface became the back face. The following pressure-sensitive adhesive was used for bonding of the back face of the base A with the PET film.

<Pressure-Sensitive Adhesive Layer for a Dicing Film>

To a reactor comprising a cooling tube, a nitrogen gas introducing tube, a thermometer, and a stirrer, 88.8 parts of 2-ethylhexyl acrylate (also referred to as "2EHA" below), 11.2 parts of 2-hydroxyethyl acrylate (also referred to as "HEA" below), 0.2 part of benzoyl peroxide, and 65 parts of toluene were placed, and a polymerization process was performed in a nitrogen gas flow at 61° C. for 6 hours to obtain an acrylic polymer A having a weight average molecular weight of 850,000. The molar ratio of 2EHA to HEA was 100 mol to 20 mol.

To the acrylic polymer A, 12 parts of 2-methacryloyloxy-ethylisocyanate (also referred to as "MOI" below) (80 mol % with respect to HEA) was added, and an addition reaction process was performed in an air flow at 50° C. for 48 hours to obtain an acrylic polymer A'.

Then, 8 parts of a polyisocyanate compound ("Coronate L" manufactured by Nippon Polyurethane Industry Co., Ltd.) and 5 parts of a photopolymerization initiator ("Irgacure 651" manufactured by Ciba Specialty Chemicals Inc.) were added to 100 parts of the acrylic polymer A' to obtain a pressure-sensitive adhesive composition solution A.

The pressure-sensitive adhesive composition solution A was applied to the surface of a PET release liner in which a silicone treatment was performed, and heated and dried at 120° C. for 2 minutes to form a pressure-sensitive adhesive layer A having a thickness of 10 μm. After that, it was heated at 50° C. for 24 hours.

<Production of Samples of Examples and Comparative Example>

The pressure-sensitive adhesive layer A was bonded to each of bases A to J, and only the wafer bonding part was irradiated from the base side with an ultraviolet ray of 300 mJ/cm$^2$ with an ultraviolet ray irradiation machine ("UM-810" manufactured by Nitto Seiki Co., Ltd.) to obtain a dicing film. The die bond films A to F were bonded to this dicing film to obtain a dicing die bond film. The combinations of the bases A to J and the die bond films A to F were as shown in Tables 1 and 2.

<Measurement of the Breaking Elongation Rate of the Die Bond Film>

A strip measurement piece of width of 10 mm, length of 30 mm, and thickness of 40 μm was cut from each of the die bond films A to J. Next, the measurement piece was stretched at a tensile speed of 0.5 mm/min and a distance between chucks of 20 mm under a condition of 25° C. using a tensile tester (Tensilon manufactured by Shimadzu Corporation) to obtain the breaking elongation rate from the following formula. The result is shown in Table 1.

Breaking Elongation Rate(%)=(((Length(mm)between chucks at breaking)−20)/20)×100

<Measurement of the Tensile Storage Modulus>

A strip piece of thickness of 200 μm and width of 10 mm was cut from each of the die bond films A to J. Next, the tensile storage modulus at −50 to 300° C. was measured under conditions of frequency of 1 Hz and rising temperature speed of 10° C./min using a solid viscosity measurement apparatus (RSA (III) manufactured by Rheometric Scientific, Inc.). The tensile storage modulus at 25° C. is shown in Tables 1 and 2.

<Measurement of the Yield Point Elongation of the Dicing Film>

A sample including the wafer bonding part and the part including the contact part was produced in which each of the wafer bonding part and the part including the contact part of the obtained dicing film has width of 10 mm and length of 60 mm. Next, a stress-strain curve of these samples was measured under conditions of 25° C., tensile speed of 300 mm/min, and distance between chucks of 50 mm using a tensile tester (Tensilon manufactured by Shimadzu Corporation) to obtain the yield point elongation.

Yield Point Elongation(%)=(((Length(mm)between chucks at yielding)−50)/50)×100

<Measurement of the Tensile Strength of the Dicing Film>

A sample of the wafer bonding part and of the part including the contact part of each of the obtained dicing film was produced in which each of the wafer bonding part and of the part including the contact part of each of the obtained dicing film has width of 25 mm. Next, the tensile strength of the sample at 10% elongation was obtained at 25° C., a distance between chucks of 100 mm, and a tensile speed of 300 ram/min using a tensile tester (Tensilon manufactured by Shimadzu Corporation). The measured tensile strength is the tensile strength in the MD (Machine Direction) direction. The results are shown in Tables 1 and 2.

<Calculation of a Difference of the Tensile Strengths>

[(Tensile strength of the contact part)−(Tensile strength of the wafer bonding part)] was calculated. The results are shown in Tables 1 and 2.

<Measurement of the Dynamic Friction Coefficient>

The dynamic friction coefficient of the contact part of the obtained dicing film was measured. The dynamic friction coefficient was measured as follows.

Figure 10:
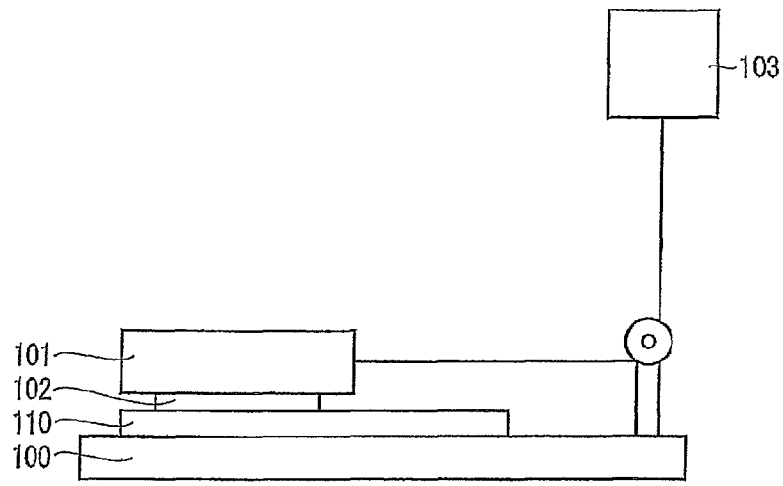
FIG. 10 is a diagram for explaining a method of measuring the dynamic friction coefficient.

FIG. 10 is a diagram for explaining a method of measuring the dynamic friction coefficient. First, as shown in FIG. 10, a stainless steel plate 100 of 200 mm×500 mm was prepared, this plate 100 and a measurement object 110 (dicing film) of 200 mm×500 mm were bonded together with the pressure-sensitive adhesive layer side as the bonding surface. A weight 101 of 50 mm×50 mm was prepared in which a sliding piece 102 of 50 mm×50 mm was bonded. Three weights 101 were prepared so as to become 100 N, 200 N, and 300 N by the sliding piece 102 being bonded. "Nitoflon No. 903UL" manufactured by Nitto Denko Corporation was used as the sliding piece 102.

Figure 11:
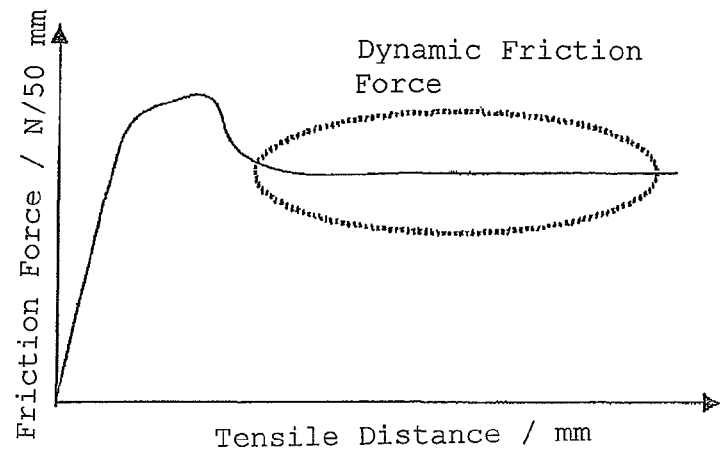
FIG. 11 is a graph schematically showing the relationship between the tensile distance and the friction force when the dynamic friction coefficient is measured.
Figure 12:
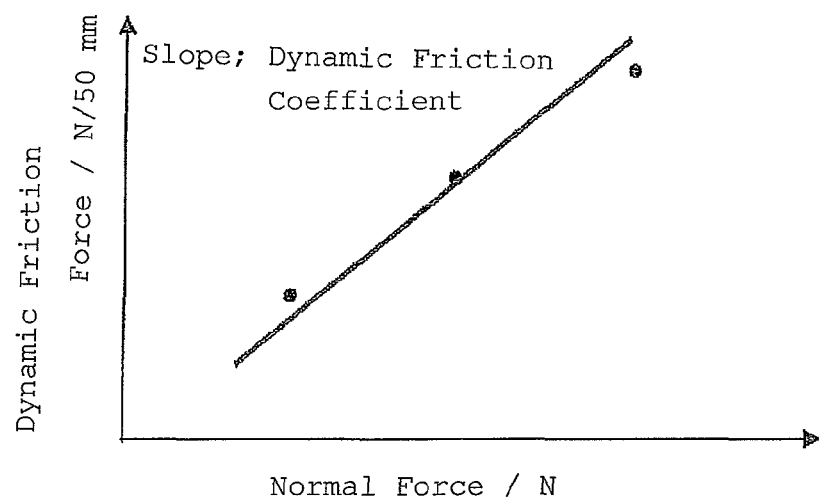
FIG. 12 is a graph schematically showing the relationship between the normal force and the dynamic friction force when the dynamic friction coefficient is measured.

Next, the weight 101 with the sliding piece 102 was loaded on the measurement object 110, and the weight was pulled by a tensile tester 103 to detect the force that is applied to the load cell of the tensile tester 103. At this time, the peak of the static friction force was ignored, and the force after a relative shear movement between the contact surfaces was started was made to be the dynamic friction force (N/50 mm) (refer to FIG. 11). Tensilon manufactured by Shimadzu Corporation was used as the tensile tester 103, and the tensile conditions were a tensile speed of 300 ram/min and a tensile moving distance of 100 mm. The above-described measurement was performed on the weights 101 of 100 N, 200 N, and 300 N, and the relationship between the used weight and the measured dynamic friction force was plotted as shown in FIG. 12. Then, an approximation straight line was drawn from three plotted points, and its slope was made to be the dynamic friction coefficient. The results are shown in Tables 1 and 2.

<Measurement of the Surface Roughness Ra>

The obtained dicing film was bonded and fixed to a flat and smooth mirror wafer, and the surface roughness Ra of the contact part was measured in the MD direction using a surface roughness measurement machine ("Surftest SJ-301" manufactured by Mitutoyo Corporation). The results are shown in Tables 1 and 2.

<Measurement of the Peeling Strength of the Die Bond Film and the Dicing Film>

A piece having a size of 100 mm×100 mm was cut out from the wafer bonding part of the dicing die bond film, and a PET film ("BT-315" manufactured by Nitto Denko Corporation, thickness of 70 µm) was bonded to the surface side of the die bond film. After bonding, the PET film was peeled from the dicing film side using a tensile tester (Tensilon manufactured by Shimadzu Corporation), and the peeling strength at that time was measured. Then, the obtained value was divided by 5 to calculate the peeling strength at a width of 20 mm. The measurement conditions were 23° C., a peeling angle of 180 degree, and a peeling speed of 300 mm/min. The results are shown in Tables 1 and 2.

(Confirmation of Breakage)<

<Case in which a Step (Step 1) was Adopted in which a Reformed Region was Formed on the Scheduled Dividing Lines 4L by Irradiating the Semiconductor Wafer with a Laser Beam>

A reformed region was formed in the interior of the semiconductor wafer by focusing condensing points in the interior of the semiconductor wafer and irradiating the semiconductor wafer with a laser beam at the surface of the semiconductor wafer along the lattice-shaped (10 mm×10 mm) scheduled dividing lines using ML300-Integration manufactured by Tokyo Seimitsu Co., Ltd. as a laser beam machining apparatus. A silicon wafer (thickness: 50 µm, outer diameter: 12 inches) was used as the semiconductor wafer. The irradiation conditions of the laser beam were as follows.

<Laser Beam Irradiation Conditions>

(A) Laser Beam

Laser Beam Source Semiconductor laser excitation Nd:YAG laser

Wavelength 1064 nm
Sectional Area of Laser Spot 3.14×10$^{-8}$ cm$^2$
Laser Oscillation Form Q switch pulse
Repetition Frequency 100 kHz
Pulse Width 30 ns
Output 20 µJ/pulse
Quality of Laser Beam TEM00 40
Polarization Characteristic Linear polarization (B) Beam Collecting Lens
Magnification 50 times
NA 0.55
Transmittance to Laser Beam Wavelength 60%

(C) Movement Speed of the Stage on which Semiconductor Substrate is Loaded 100 mm/sec A breaking test was performed on each of the die bond films after bonding the semiconductor wafer on which the pretreatment by a laser beam was performed. The conditions of expansion in the breaking test were room temperature (25° C.), an expansion speed of 400 mm/sec., and an expansion amount of 20 mm. As a result of the breaking test, the case in which there was no occurrence of insufficient breakage is regarded as good, and the case in which there were places of insufficient breakage is regarded as poor.

<The Case of Forming the Grooves on the Surface of the Semiconductor Wafer and then Adopting a Step (Step 2) of Performing a Backside Grinding>

The cut grooves of a lattice shape (10 mm×10 mm) were formed on a semiconductor wafer (thickness of 500 µm) by a blade dicing process. The depth of the cut grooves was 250 µm.

Next, the surface of the semiconductor wafer was protected by a protective tape, and the backside grinding was performed until the thickness became 50 µm to obtain individual divided semiconductor chips (10 mm×10 mm×50 µm). These semiconductor chips were bonded to each of the dicing die bond films of the Examples and Comparative Examples, and then a breaking test was performed. The expansion conditions at the breaking test were room temperature (25° C.), an expansion speed of 400 mm/sec, and an expansion amount of 20 mm. For the result of the breaking test, as shown in the case of the Step 1, the case in which there is no position of inferior breaking was marked as O, and the case in which there is a position of inferior breaking was marked as x. The results are shown in Tables 1 and 2.

<Pickup Property>

The semiconductor chip obtained from dicing was pushed up from the dicing film side with a needle to pick up the semiconductor chip from the pressure-sensitive adhesive layer together with the die bond film. The pickup condition was as follows. Under the following conditions, the case in which the semiconductor chip was picked up was marked as O, and the case in which the semiconductor chip was not picked up was marked as X. The results are shown in Tables 1 and 2.

[Pickup Condition]
Pickup apparatus: "SPA-300" manufactured by Shinkawa Ltd.
Number of pickup needles: 9 needles
Needle pushing speed: 5 mm/sec
Needle pushing distance: 600 µm
Pickup time: 1 sec
Expansion amount: 12.5 mm
Needle type: F0.7*15 deg*101*350 µm
Collet: "RUBBER TIP" manufactured by MICRO-MECHANICS Ltd., product number 13-034-126

TABLE 1

|  | Example 1 | Example 2 | Example 3 | Example 4 | Example 5 |
|---|---|---|---|---|---|
| Base | Base A | Base B | Base C | Base D | Base J |
| Thickness (μm) of Dicing Film (Contact Part) | 126 | 170 | 110 | 110 | 136 |
| Thickness (μm) of Dicing Film (Wafer Bonding Part) | 110 | 170 | 110 | 110 | 110 |
| Die Bond Film | B | C | D | E | B |
| Breaking Elongation Rate (%) of Die Bond Film | 101 | 132 | 470 | 496 | 101 |
| Modulus (GPa) of Die Bond film | 3.78 | 2.34 | 5.72 | 0.296 | 3.78 |
| Yield Point Elongation (%) of Dicing Film (Contact Part) | 83 | 92 | 238 | 246 | 83 |
| Yield Point Elongation (%) of Dicing Film (Wafer Bonding Part) | 35 | 92 | 238 | 246 | 35 |
| Tensile Strength (N) of Dicing Film (Contact Part) | 65 | 25 | 20 | 16 | 65 |
| Tensile Strength (N) of Dicing Film (Wafer Bonding Part) | 12 | 25 | 20 | 16 | 12 |
| [Tensile Strength of Dicing Film (Contact Part)] − [Tensile Strength of Dicing Film (Wafer Bonding Part)] (N) | 53 | 0 | 0 | 0 | 53 |
| Dynamic Friction Coefficient of the backside of base (Contact Part) | 0.01 | 0.015 | 0.006 | 0.018 | 0.007 |
| Surface Roughness Ra (μm) of the backside of base (Contact Part) | 1.41 | 0.41 | 0.42 | 0.04 | 0.04 (The lubrication treatment was performed) |
| Peeling Strength (N/20 mm) of Die Bond Film and Dicing Film | 0.04 | 0.08 | 0.09 | 0.12 | 0.04 |
| Breaking Property (Step 1) | ○ | ○ | ○ | ○ | ○ |
| Breaking Property (Step 2) | ○ | ○ | ○ | ○ | ○ |
| Pickup Property | ○ | ○ | ○ | ○ | ○ |

TABLE 2

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Base | Base E | Base F | Base G | Base H | Base I | Base A | Base A |
| Thickness (μm) of Dicing Film (Contact Part) | 140 | 145 | 110 | 180 | 110 | 126 | 126 |
| Thickness (μm) of Dicing Film (Wafer Bonding Part) | 140 | 145 | 110 | 110 | 180 | 110 | 110 |
| Die Bond Film | B | B | B | B | B | F | A |
| Breaking Elongation Rate (%) of Die Bond Film | 101 | 101 | 101 | 101 | 101 | 520 | 35 |
| Modulus (GPa) of Die Bond film | 3.78 | 3.78 | 3.78 | 3.78 | 3.78 | 0.0737 | 52.1 |
| Yield Point Elongation (%) of Dicing Film (Contact Part) | 10 | 74 | 222 | 82 | 238 | 83 | 83 |
| Yield Point Elongation (%) of Dicing Film (Wafer Bonding Part) | 10 | 74 | 222 | 35 | 82 | 35 | 35 |
| Tensile Strength (N) of Dicing Film (Contact Part) | 40 | 13 | 14 | 83 | 20 | 65 | 65 |
| Tensile Strength (N) of Dicing Film (Wafer Bonding Part) | 40 | 13 | 14 | 12 | 83 | 12 | 12 |
| [Tensile Strength of Dicing Film (Contact Part)] − [Tensile Strength of Dicing Film (Wafer Bonding Part)] (N) | 0 | 0 | 0 | 71 | −63 | 53 | 53 |
| Dynamic Friction Coefficient of the backside of base (Contact Part) | 0.015 | 0.008 | 0.008 | 0.007 | 0.006 | 0.01 | 0.01 |
| Surface Roughness Ra (μm) of the backside of base (Contact Part) | 0.43 | 0.41 | 0.46 | 0.04 (The lubrication treatment was performed) | 0.42 | 1.4 | 1.41 |
| Peeling Strength (N/20 mm) of Die Bond Film and Dicing Film | 0.04 | 0.04 | 0.04 | 0.04 | 0.04 | 0.08 | 0.09 |
| Breaking Property (Step 1) | X | X | X | X | X | X | X |
| Breaking Property (Step 2) | X | X | X | X | X | X | X |
| Pickup Property | ○ | ○ | — | — | — | — | — |

The invention claimed is:

1. A dicing die bond film comprising a die bond layer provided on a dicing layer, wherein:
   the dicing layer has:
   a ring bonding part to which a dicing ring is bonded, the ring bonding part located at an outer circumference of the dicing layer,
   a wafer bonding part to which a semiconductor wafer is bonded, the wafer bonding part located inward of the ring bonding part, and
   a contact part to which an outer circumference of a push-up jig contacts the dicing layer between the ring bonding part and the wafer bonding part,
   a tensile strength of the contact part of the dicing layer at 25° C. is 15 N or more and 80 N or less, and a yield point elongation of the contact part is 80% or more,
   a tensile strength of the wafer bonding part of the dicing layer at 25° C. is 10 N or more and 70 N or less, and a yield point elongation of the wafer bonding part is 30% or more,
   ((the tensile strength of the contact part)−(the tensile strength of the wafer bonding part)) is 0 N or more and 60 N or less, and
   a breaking elongation rate of the die bond layer at 25° C. is more than 40% and 500% or less.

2. The dicing die bond film according to claim 1, wherein the dicing layer has a structure in which a base and a reinforcing member are laminated at least in the contact part.

3. The dicing die bond film according to claim 1, wherein a dynamic friction coefficient of the contact part of the dicing layer is 0 to 0.02.

4. The dicing die bond film according to claim 3, wherein a surface roughness Ra of the contact part is 0.03 μm or more and 1.5 μm or less, or a lubricant treatment is performed on the contact part.

5. The dicing die bond film according to claim 2, wherein a dynamic friction coefficient of the contact part of the dicing layer is 0 to 0.02.

6. The dicing die bond film according to claim 5, wherein a surface roughness Ra of the contact part is 0.03 μm or more and 1.5 μm or less, or a lubricant treatment is performed on the contact part.

7. A method of forming a semiconductor element comprising:
   (a) providing a semiconductor wafer adhered to the dicing die bond film of claim 1, wherein the semiconductor wafer has been modified to provide lines where the semiconductor wafer is to be divided into semiconductor elements, and wherein the semiconductor wafer is attached to the dicing die bond film via the die bond layer; and
   (b) applying a tensile force to the dicing die bond film to break the semiconductor wafer and the die bond layer.

8. The method of forming a semiconductor element according to claim 7, wherein the applying tensile force comprises bonding a dicing ring to the ring bonding part of the dicing layer, fixing the dicing ring in a wafer expansion machine, and elevating a push-up jig to apply a tension to the dicing die bond film.

9. The method of forming a semiconductor element according to claim 7, whereby the semiconductor wafer and the die bond layer are broken at the same time.

* * * * *